United States Patent
Kim et al.

(10) Patent No.: US 8,767,450 B2
(45) Date of Patent: Jul. 1, 2014

(54) MEMORY CONTROLLERS TO REFRESH MEMORY SECTORS IN RESPONSE TO WRITING SIGNALS AND MEMORY SYSTEMS INCLUDING THE SAME

(75) Inventors: Doo-gon Kim, Hwaseong-si (KR);
Hui-kwon Seo, Hwaseong-si (KR);
Cheol-kyu Kim, Seocho-gu (KR);
Sei-jin Kim, Seongnam-si (KR);
Yoon-ho Khang, Yongin-si (KR);
Han-gu Sohn, Suwon-si (KR); Tae-yon Lee, Seongbuk-gu (KR); Dae-won Ha, Gangnam-gu (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/662,949

(22) Filed: May 13, 2010

(65) Prior Publication Data

US 2010/0246247 A1 Sep. 30, 2010

Related U.S. Application Data

(63) Continuation-in-part of application No. 12/073,499, filed on Mar. 6, 2008, now Pat. No. 8,003,970, and a continuation-in-part of application No. 12/320,963, filed on Feb. 10, 2009, now Pat. No. 8,050,083.

(30) Foreign Application Priority Data

Aug. 21, 2007 (KR) .................. 10-2007-0084032
Feb. 11, 2008 (KR) .................. 10-2008-0012292
May 14, 2009 (KR) .................. 10-2009-0042183
Jun. 15, 2009 (KR) .................. 10-2009-0052975

(51) Int. Cl.
*G11C 11/00* (2006.01)

(52) U.S. Cl.
USPC ............................. 365/163; 365/222

(58) Field of Classification Search
USPC .............. 365/222, 185.09; 710/52; 711/106
See application file for complete search history.

(56) References Cited

U.S. PATENT DOCUMENTS 5,251,177 A 10/1993 Akamatsu et al.
5,950,224 A * 9/1999 Devin .................... 711/106
(Continued)

FOREIGN PATENT DOCUMENTS

JP 2005-025903 1/2005
JP 2006-202383 8/2006
(Continued)

OTHER PUBLICATIONS

US Office Action dated Jan. 4, 2011, issued in Co-Pending U.S. Appl. No. 12/073,499.
(Continued)

*Primary Examiner* — Marcos D. Pizarro
(74) *Attorney, Agent, or Firm* — Harness, Dickey & Pierce, P.L.C.

(57) ABSTRACT

A memory system includes a memory cell array having a plurality of memory sectors. Each memory sector includes a plurality of memory cells. The memory system further includes a controller configured to write data to the memory cell array in response to a writing signal. The controller is further configured to refresh a memory sector among the plurality of memory sectors each time a writing signal is provided. When N (N is a positive integer) memory cells are programmed, a programming current is less than or equal to about 0.75 mA*N.

14 Claims, 23 Drawing Sheets

(56) References Cited

U.S. PATENT DOCUMENTS

| | | |
|---|---|---|
| 6,088,268 A | 7/2000 | Gupta et al. |
| 6,134,142 A * | 10/2000 | Hirano .................. 365/185.09 |
| 6,438,629 B1 * | 8/2002 | Huebner et al. ............... 710/52 |
| 6,535,950 B1 | 3/2003 | Funyu et al. |
| 6,633,500 B1 | 10/2003 | Chou et al. |
| 6,668,303 B2 | 12/2003 | Pio |
| 6,700,815 B2 | 3/2004 | Le et al. |
| 6,922,350 B2 | 7/2005 | Coulson et al. |
| 6,931,480 B2 | 8/2005 | Swaminathan |
| 7,325,090 B2 | 1/2008 | Ronen |
| 8,010,739 B2 | 8/2011 | Watanabe et al. |
| 2001/0007538 A1 * | 7/2001 | Leung ........................ 365/222 |
| 2004/0047221 A1 * | 3/2004 | Tanaka ........................ 365/222 |
| 2004/0052142 A1 | 3/2004 | Ikehashi et al. |
| 2004/0062070 A1 | 4/2004 | Coulson et al. |
| 2004/0109351 A1 | 6/2004 | Morimoto et al. |
| 2004/0218435 A1 * | 11/2004 | Takahashi et al. ............ 365/200 |
| 2006/0004955 A1 * | 1/2006 | Ware et al. .................... 711/106 |
| 2006/0268632 A1 * | 11/2006 | Schnell et al. ................ 365/194 |
| 2007/0003730 A1 | 1/2007 | Kojima et al. |
| 2007/0033336 A1 * | 2/2007 | Oh ................................ 711/104 |
| 2007/0195582 A1 * | 8/2007 | Sakata et al. .................. 365/148 |
| 2008/0164452 A1 | 7/2008 | Joseph et al. |
| 2008/0170431 A1 | 7/2008 | Sheu et al. |
| 2008/0259708 A1 | 10/2008 | Tsukazaki et al. |
| 2009/0003174 A1 | 1/2009 | Tsuchino et al. |
| 2009/0222616 A1 | 9/2009 | Yano et al. |
| 2010/0034024 A1 | 2/2010 | Mochizuki et al. |
| 2011/0219203 A1 | 9/2011 | Nurminen et al. |

FOREIGN PATENT DOCUMENTS

| | | |
|---|---|---|
| KR | 10-2004-0052409 | 6/2004 |
| KR | 10-2005-0042183 | 5/2005 |
| KR | 10-2005-0062384 | 6/2005 |

OTHER PUBLICATIONS

Tae-Jin Park et al. "Phase transition characteristics of Bi/Sn doped $Ge_2SB_2Te_5$ thin film for PRAM application," Science Direct Thin Solid Films 515 (2007) 5049-5033. Nov. 21, 2006.

U.S. Notice of Allowance dated Apr. 14, 2011 issued in U.S. Appl. No. 12/073,499.

U.S. Office Action dated Nov. 9, 2012 issued in U.S. Appl. No. 12/662,948.

U.S. Office Action dated Mar. 21, 2013 issued in U.S. Appl. No. 12/662,948.

U.S. Office Action dated Jun. 11, 2012 issued in U.S. Appl. No. 12/662,948.

* cited by examiner

MEMORY CONTROLLERS TO REFRESH MEMORY SECTORS IN RESPONSE TO WRITING SIGNALS AND MEMORY SYSTEMS INCLUDING THE SAME

CROSS-REFERENCE TO RELATED PATENT APPLICATIONS

This application is a continuation-in-part of U.S. patent application Ser. No. 12/073,499, filed on Mar. 6, 2008, which claims priority under 35 U.S.C. §119 to Korean Patent Application No. 10-2007-0084032 filed on Aug. 21, 2007 and U.S. patent application Ser. No. 12/320,963, filed on Feb. 10, 2009, which claims priority under 35 U.S.C. §119 to Korean Patent Application No. 10-2008-0012292 filed on Feb. 11, 2008. This application also claims priority under 35 U.S.C. §119 to Korean Patent Application No. 10-2009-0052975, filed on Jun. 15, 2009, and Korean Patent Application No. 10-2009-0042183, filed on May 14, 2009. The entire contents of each of the above-mentioned applications are incorporated herein by reference.

BACKGROUND

1. Field

Example embodiments relate to phase-change random access memories (PRAMs), for example, PRAMs having a relatively low crystallization temperature, and relatively quick operation speed. Example embodiments also relate to memory systems capable of performing a refresh operation and semiconductor memory devices capable of suppressing data loss. Example embodiments also relate to methods of operating and methods of manufacturing semiconductor memory devices

2. Description of the Related Art

A phase-change random access memory (PRAM) uses characteristics of a phase-change material, such as GeSbTe, to store data. For example, when an electrical pulse is applied to the phase-change material, a state of the phase-change material changes between crystalline and amorphous states according to heat generated in a localized area. A memory cell, which memorizes PRAM binary information, includes a phase-change layer, a bottom electrode contact (BEC) layer, and a switching device, such as a transistor.

In a conventional PRAM, a transistor is formed on a silicon wafer, and a BEC layer is connected to a source or a drain of the transistor. A conventional phase change layer is formed of a GST (GeSbTe) based material such as a $Ge_2Sb_2Te_5$ composition. The GST based material is referred to as a chalcogenide, which is the same material used in an optical recording apparatus such as a digital video disc (DVD) or a re-writable compact disc (CD-RW). The BEC layer is formed in order to heat the phase-change layer. According to the extent of the heating of the phase-change layer, the phase of the conventional PRAM is changed between crystalline and amorphous states, and a resistance value changes according to the state of the conventional PRAM. Binary information may be stored and read because a current or voltage changes according to resistance of the phase-change layer.

Operating speeds of PRAMs depend on the speed at which the phase-change layer transitions between a crystalline structure and an amorphous structure. A GST material used in conventional PRAMs has a relatively high crystallization temperature, and relatively slow crystallization speed. Accordingly, when the PRAM changes from a set state having a crystalline structure to a reset state having an amorphous structure, the required reset current is relatively high. Also, when the PRAM changes from a reset state having an amorphous structure to a set state having a crystalline structure, the required set time is relatively long (e.g., greater than or equal to about 100 ns). Accordingly, it is relatively difficult to realize a PRAM that operates at relatively high speeds.

SUMMARY

Example embodiments of inventive concepts provide phase-change random access memories (PRAMs), memory devices, memory systems, methods of operating and methods of manufacturing the same. According to at least one example embodiment, a PRAM includes a phase-change layer formed of a material having a lower crystallization temperature and quicker information storing time because of a faster crystallization speed than a conventional GST phase-change material used in a phase-change layer of a conventional PRAM.

A memory system in accordance with an example embodiment includes a memory cell array having a plurality of memory sectors. Each memory sector includes a plurality of memory cells. The memory system further includes a controller configured to write data in the memory cell array in response to a writing signal. The controller is further configured to refresh a memory sector among the plurality of memory sectors each time a writing signal is provided. When N memory cells are programmed, a programming current is less than or equal to about 0.75 mA*N, and N is a positive integer.

Example embodiments also provide semiconductor memory devices. According to at least one example embodiment, a semiconductor memory device includes: a memory cell; a writing driver; a sense amplifier; and a controller. The writing driver is configured to provide a program current to the memory cell to write data in the memory cell. The sense amplifier is configured to perform a read operation to read data written in the memory cell. The controller is configured to provide a rewriting signal to the writing driver after the sense amplifier performs the read operation a given number of times. When the memory cell is programmed, the writing driver provides a program current less than or equal to about 0.75 mA. The rewriting signal is for rewriting data read by the sense amplifier to the memory cell.

Example embodiments of inventive concepts also provide memory controllers. According to at least one example embodiment, the memory controller is configured to generate a writing control signal for transmitting data to a memory device and to generate a refresh control signal for refreshing data stored in the memory device in response to a received writing command.

According to at least some example embodiments, the memory controller may include a refresh register configured to store location information for a refreshed memory sector among the plurality of memory sectors. The memory controller may also be configured to generate the refresh control signal such that a refresh operation is performed on a target sector, which is subsequent to the refreshed memory sector. The memory controller may further include: a buffer memory configured to store at least one of data to be written in the memory device and data received from the memory device; and a refresh memory configured to store data stored in the target sector. The memory controller may further include a time control unit configured to calculate a time difference by comparing completion time information for a refresh cycle with current time information, and configured to determine whether to perform a refresh operation by comparing the calculated time difference with reference time information. The memory controller may be coupled to a Low Power Double Data Rate 2 (LPDDR2) memory and configured to control the LPDDR2 memory.

According to at least one example embodiment, a phase-change random access memory (PRAM) includes: a bottom electrode; a bottom electrode contact layer formed on a portion of an upper surface of the bottom electrode; an insulating layer formed at each side of the bottom electrode contact layer; a phase-change layer formed on the bottom electrode contact layer and the insulating layer; and a top electrode formed on the phase-change layer. The phase-change layer is formed of a phase-change material having a crystallization temperature between about 100° C. and about 150° C., inclusive.

According to at least some example embodiments, the phase-change layer may be formed of a material having a crystallization time between about 1 ns and about 50 ns, inclusive. In at least one example embodiment, the phase-change layer may be formed of a material having crystallization time between 1 and 20 ns, inclusive.

For example, the phase-change layer may be formed of any one of $Ge_2(Sb_{1-x}Bi_x)_2Te_5 (0<x<1)$ and $Ge_3Bi_2Te_6$(GBT).

At least one other example embodiment provides a method of manufacturing a PRAM. According to at least this example embodiment, bottom electrode is formed and an insulating layer is formed on the bottom electrode. A contact hole exposing the bottom electrode is formed through the insulating layer, and a bottom electrode contact layer is formed by coating a resistive heater. A phase-change layer is formed on the insulating layer and the bottom electrode contact layer. The phase-change layer has a crystallization temperature between about 100° C. and about 150° C., inclusive.

According to at least some example embodiments, the phase-change layer may be $Ge_2(Sb_{1-x}Bi_x)_2Te_5 (0<x<1)$, which is formed using atomic layer deposition (ALD) or chemical vapor deposition (CVD) by supplying a Ge precursor, a Sb precursor, a Bi precursor, and a Te-precursor. Alternatively, the $Ge_2(Sb_{1-x}Bi_x)_2Te_5$ ($0<x<1$) may be evaporated, sputter deposited, or deposited using pulsed laser deposition (PLD) by using Ge, Sb, Bi, and Te sources.

The Ge precursor may include at least one material of $(CH_3)_4Ge$, $(C_2H_5)_4Ge$, $(n-C_4H_9)_4Ge$, $(i-C_4H_9)_4Ge$, $(C_6H_5)_4Ge$, $(CH_2=CH)_4Ge$, $(CH_2CH=CH_2)_4Ge$, $(CF_2=CF)_4Ge$, $(C_6H_5CH_2CH_2CH_2)_4Ge$, $(CH_3)_3(C_6H_5)Ge$, $(CH_3)_3(C_6H_5CH_2)Ge$, $(CH_3)_2(C_2H_5)_2Ge$, $(CH_3)_2(C_6H_5)_2Ge$, $CH_3(C_2H_5)_3Ge$, $(CH_3)_3(CH=CH_2)Ge$, $(CH_3)_3(CH_2CH=CH_2)Ge$, $(C_2H_5)_3(CH_2CH=CH_2)Ge$, $(C_2H_5)_3(C_5H_5)Ge$, $(CH_3)_3GeH$, $(C_2H_5)_3GeH$, $(C_3H_7)_3GeH$, $Ge(N(CH_3)_2)_4$, $Ge(N(CH_3)(C_2H_5))_4$, $Ge(N(C_2H_5)_2)_4$, $Ge(N(i-C_3H_7)_2)_4$, and $Ge[N(Si(CH_3)_3)_2]_4$.

The Sb precursor may include at least one material of $Sb(CH_3)_3$, $Sb(C_2H_5)_3$, $Sb(i-C_3H_7)_3$, $Sb(n-C_3H_7)_3$, $Sb(i-C_4H_9)_3$, $Sb(t-C_4H_9)_3$, $Sb(N(CH_3)_2)_3$, $Sb(N(CH_3)(C_2H_5))_3$, $Sb(N(C_2H_5)_2)_3$, $Sb(N(i-C_3H_7)_2)_3$, and $Sb[N(Si(CH_3)_3)_2]_3$.

The Bi precursor may include at least one material of $Bi(Ph)_3$, and $Bi(TMHD)_3$.

The Te-precursor may include at least one material of $Te(CH_3)_2$, $Te(C_2H_5)_2$, $Te(n-C_3H_7)_2$, $Te(i-C_3H_7)_2$, $Te(t-C_4H_9)_2$, $Te(i-C_4H_9)_2$, $Te(CH_2=CH)_2$, $Te(CH_2CH=CH_2)_2$, and $Te[N(Si(CH_3)_3)_2]_2$.

BRIEF DESCRIPTION OF THE DRAWINGS

Example embodiments will become more apparent by describing in detail the attached drawings in which.

DETAILED DESCRIPTION

Figure 1:
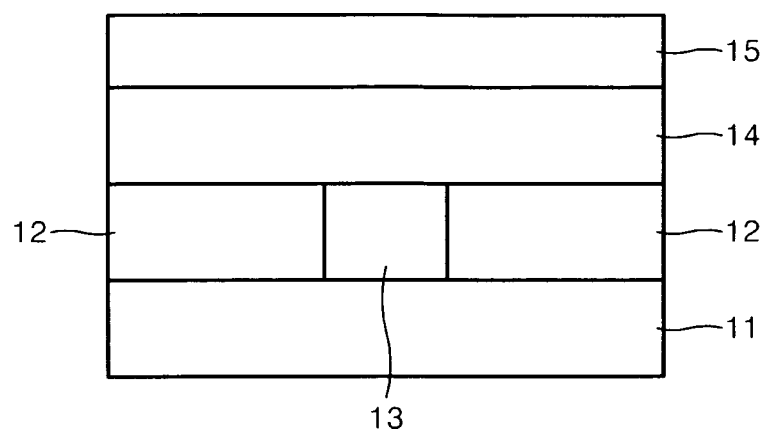
FIG. 1 is a diagram illustrating a phase-change random access memory (PRAM) according to an example embodiment of inventive concepts.

Various example embodiments will now be described more fully with reference to the accompanying drawings in which some example embodiments are shown. In the drawings, the thicknesses of layers and regions are exaggerated for clarity.

Detailed illustrative embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments are to cover all modifications, equivalents, and alternatives falling within the applicable scope. Like numbers refer to like elements throughout the description of the figures.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or," includes any and all combinations of one or more of the associated listed items.

Further, when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a diagram illustrating a phase-change random access memory (PRAM) according to an example embodiment of inventive concepts.

Referring to FIG. 1, a bottom electrode contact (BEC) layer 13 is formed on a surface portion or area of a bottom electrode 11. An insulating layer 12 is formed on the bottom electrode 11 at each side of the bottom electrode contact layer 13. A phase-change layer 14 (also referred to herein as a phase-change material layer) is formed on the insulating layer 12 and the bottom electrode contact layer 13. A top electrode 15 is formed on the phase-change layer 14.

Example materials forming each layer of a PRAM and a method of manufacturing a PRAM according to example embodiments will now be described in more detail.

According to at least some example embodiments, the bottom electrode 11 may be formed of a conductive material such as a metal or a metal oxide. The insulating layer 12 is laminated on the bottom electrode 11 using a dielectric material such as $SiO_2$, $SiON$, $Si_3N_4$, or the like. A contact hole, exposing the bottom electrode 11, is formed through the insulating layer 12, and the bottom electrode contact layer 13 is formed by depositing a resistive heater in the contact hole. In one example, the bottom electrode contact layer 13 may be formed of TiN, TiAlN or the like. The phase-change layer 14 is formed on the insulating layer 12 and the bottom electrode contact layer 13. The bottom electrode contact layer 13 heats the phase-change layer 14 according to an applied set pulse or reset pulse.

In at least this example embodiment, the bottom electrode contact layer 13 is formed to have a width narrower than the width of the bottom electrode 11. Accordingly, the bottom electrode contact layer 13 has a relatively small contact area, and thus, increases heating efficiency of the phase-change layer 14. Also, the top electrode 15 is formed on the phase-change layer 14. Like the bottom electrode 11, the top electrode 15 is formed of a conductive material such as a metal or a metal oxide.

In a PRAM according to at least this example embodiment, the phase-change layer 14 has a crystallization temperature lower than a conventional GST phase-change material, and is formed of a material having relatively short crystallization time. For example, the crystallization temperature may be less than or equal to about 150° C., or between about 100° C. and about 150° C., inclusive. The crystallization time may be between about 1 ns and about 50 ns, inclusive, for example, between about 1 ns and about 20 ns, inclusive. Examples of materials having the above-described characteristics include $Ge_2(Sb_{1-x}Bi_x)_2Te_5$ (GSBT, 0<x<1) and $Ge_3Bi_2Te_6$ (GBT). PRAMs according to at least some example embodiments may be formed through various physical vapor deposition methods (PVDs), such as evaporation, sputter deposition, and pulsed layer deposition (PLD), or processes such as atomic layer deposition (ALD) and chemical vapor deposition (CVD).

When the phase-change layer 14 is formed of $Ge_2(Sb_{1-x}Bi_x)_2Te_5$, for example, the phase-change layer 14 may be formed by supplying each Ge precursor, Sb precursor, Bi precursor, and Te-precursor, or by evaporating Ge, Sb, Bi, and Te sources. Examples of each precursor are given below.

The Ge precursor may be one of $(CH_3)_4Ge$, $(C_2H_5)_4Ge$, $(n-C_4H_9)_4Ge$, $(i-C_4H_9)_4Ge$, $(C_6H_5)_4Ge$, $(CH_2=CH)_4Ge$, $(CH_2CH=CH_2)_4Ge$, $(CF_2=CF)_4Ge$, $(C_6H_5CH_2CH_2CH_2)_4Ge$, $(CH_3)_3(C_6H_5)Ge$, $(CH_3)_3(C_6H_5CH_2)Ge$, $(CH_3)_2(C_2H_5)_2Ge$, $(CH_3)_2(C_6H_5)_2Ge$, $CH_3(C_2H_5)_3Ge$, $(CH_3)_3(CH=CH_2)Ge$, $(CH_3)_3(CH_2CH=CH_2)Ge$, $(C_2H_5)_3(CH_2CH=CH_2)Ge$, $(C_2H_5)_3(C_5H_5)Ge$, $(CH_3)_3GeH$, $(C_2H_5)_3GeH$, $(C_3H_7)_3GeH$, $Ge(N(CH_3)_2)_4$, $Ge(N(CH_3)(C_2H_5))_4$, $Ge(N(C_2H_5)_2)_4$, $Ge(N(i-C_3H_7)_2)_4$, and $Ge[N(Si(CH_3)_3)_2]_4$.

The Sb precursor may be one of $Sb(CH_3)_3$, $Sb(C_2H_5)_3$, $Sb(i-C_3H_7)_3$, $Sb(n-C_3H_7)_3$, $Sb(i-C_4H_9)_3$, $Sb(t-C_4H_9)_3$, $Sb(N(CH_3)_2)_3$, $Sb(N(CH_3)(C_2H_5))_3$, $Sb(N(C_2H_5)_2)_3$, $Sb(N(i-C_3H_7)_2)_3$, and $Sb[N(Si(CH_3)_3)_2]_3$.

The Bi precursor may be $Bi(Ph)_3$ or $Bi(TMHD)_3$.

Also, the Te-precursor may be one of $Te(CH_3)_2$, $Te(C_2H_5)_2$, $Te(n-C_3H_7)_2$, $Te(i-C_3H_7)_2$, $Te(t-C_4H_9)_2$, $Te(i-C_4H_9)_2$, $Te(CH_2=CH)_2$, $Te(CH_2CH=CH_2)_2$, and $Te[N(Si(CH_3)_3)_2]_2$.

Figure 2:
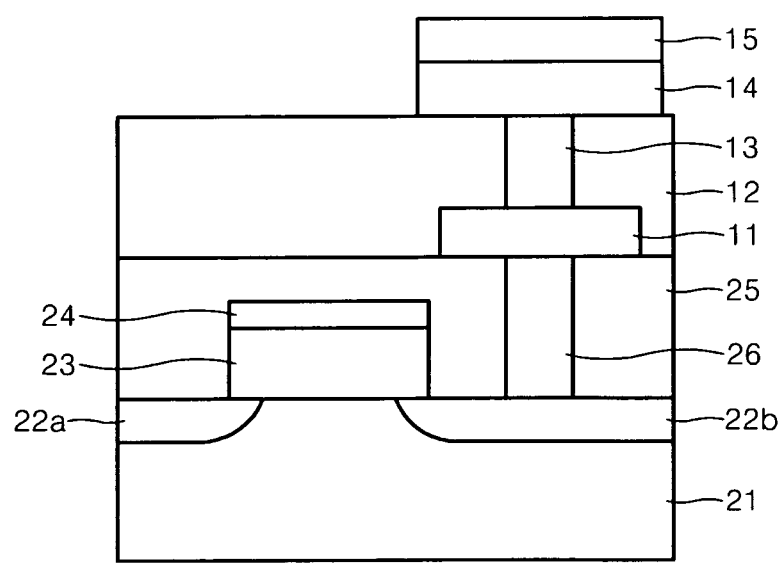
FIG. 2 is a diagram illustrating an example embodiment of a PRAM connected to a transistor.

FIG. 2 is diagram illustrating an example embodiment of a PRAM connected to a switching device. In this example, the switching device is a switching transistor formed on a substrate 21. However, example embodiments may also be implemented in conjunction with other switching devices such as a diode or the like.

Referring to FIG. 2, a source 22a and a drain 22b are formed in the substrate 21. A gate insulating layer 23 and a gate electrode 24 are sequentially formed as a gate structure on the substrate 21 between the source 22a and the drain 22b. An interlayer insulating layer 25 is formed on the switching transistor. A contact hole is formed through the interlayer insulating layer 25 to expose a portion of the drain 22b. A conductive plug 26 is formed in the contact hole.

Still referring to FIG. 2, a bottom electrode ills formed on the conductive plug 26, and a bottom electrode contact layer 13 is formed on a portion of the bottom electrode 11. An insulating layer 12 is formed on the bottom electrode 11 and the interlayer insulating layer 25 at each side of the bottom electrode contact layer 13. A phase-change material layer 14 is formed on the insulating layer 12 and the bottom electrode contact layer 13. A top electrode 15 is formed on the phase-change material layer 14.

Figure 3:
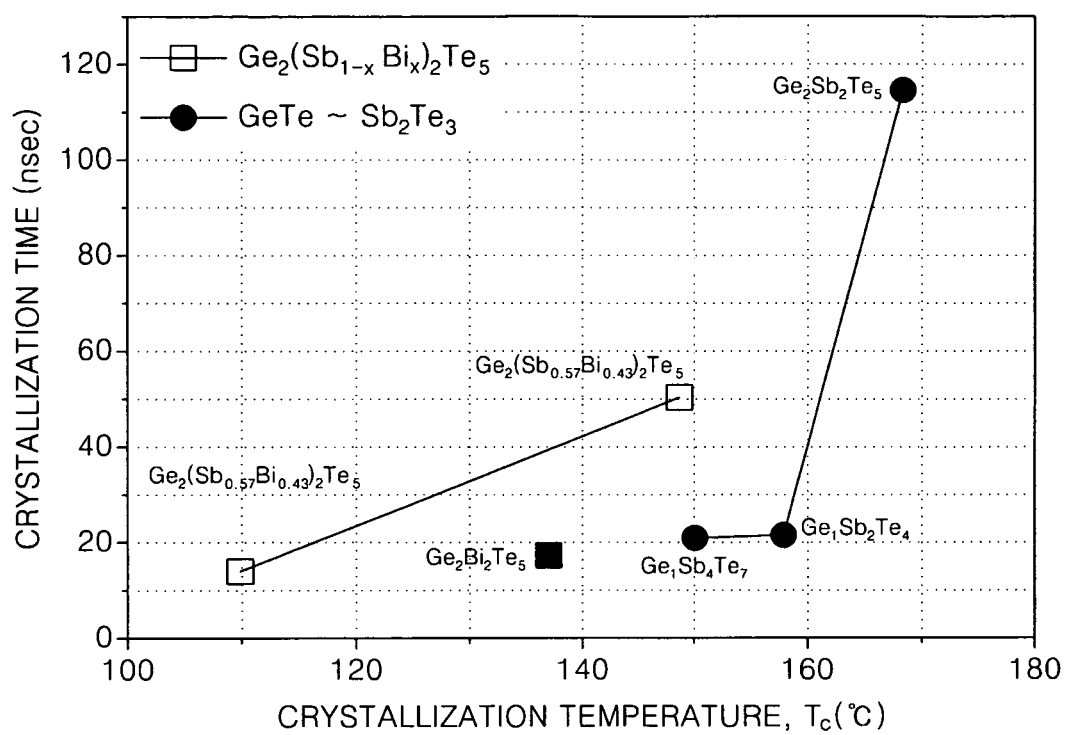
FIG. 3 is a graph illustrating example crystallization temperatures and crystallization times for various phase-change materials.

FIG. 3 is an example graph illustrating crystallization temperatures and crystallization times for various phase-change. In FIG. 3, crystallization times of three chalcogenide materials, GST, GSBT and GBT, are shown according to crystallization temperature.

Referring to FIG. 3, when a conventional PRAM material such as GST ($Ge_2Sb_2Te_5$) is used, crystallization temperature is relatively high and crystallization time is also relatively long. However, according to example embodiments, data recording time may be reduced (e.g., substantially reduced) by using a phase-change material such as GSBT, which has relatively low crystallization temperature and relatively short crystallization time. Also, according to example embodiments, data integrity may be improved more efficiently through a process of re-recording recorded data using a phase-change material having relatively low crystallization temperature as a storage node.

Figure 4:
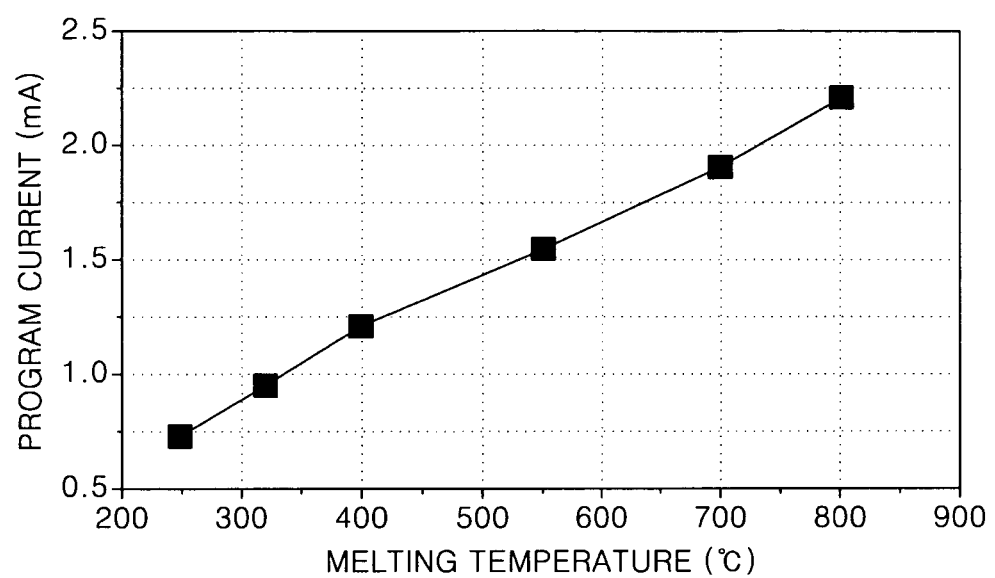
FIG. 4 is a graph illustrating an example programming current according to phase-change temperature.

FIG. 4 is an example graph illustrating a programming current according to phase-change temperature of a phase-change material of a PRAM according to an example embodiment of inventive concepts. More specifically, FIG. 4 illustrates temperature of a PRAM cell according to a current supplied to the PRAM cell.

Referring to FIG. 4, when phase-change temperature of the phase-change layer of the PRAM is about 250° C., a programming current value is about 0.75 mA. Meanwhile, when phase-change temperature is about 400° C., a programming current value increases (e.g., substantially increases) to about 1.25 mA. Accordingly, in a PRAM according to at least some example embodiments, a current value required for programming may be reduced (e.g., substantially reduced) by using a phase-change material that has a relatively low crystallization temperature.

In one example, the programming current value may be less than about 0.75 mA by applying a current that decreases phase-change temperature as shown in FIG. 4, without the need to change the physical size of the transistor and/or phase-change material.

In past decades, sizes of memory cells of dynamic random access memories (DRAMs) or flash memories have decreased, which has increased memory densities. Generally, the smaller memory cells have been prepared to operate at a lower operating temperatures to reduce power consumption. And, users have been able to store a larger capacity of data at the same or substantially the same price. Similarly, one of ordinary skill in the art would understand that it is possible to apply a current less than or equal to about 0.75 mA to increase the phase-change temperature illustrated in FIG. 4, for example, up to about 250° C.

According to at least one other example embodiment, a programming current value when programming one memory cell may be less than about 0.75 mA by using a structure where physical sizes of a diode and a phase-change material decrease.

For example, when a critical size (e.g., a critical dimension, which is a size of a location that is to be managed while manufacturing a semiconductor device) of a memory cell on which a refresh write operation is performed using a write current of about 0.75 mA is about 200 nm, a write operation may be performed on the memory cell using a write current less than about 0.75 mA in the smaller critical size (e.g., about 92 nm, about 23 nm, or about 9 nm).

At least some example embodiments provide a PRAM including a storage node formed of a phase change material layer having lower phase-change temperature and shorter phase-change time than a conventional GST phase-change material.

Accordingly, data storing time may be reduced (e.g., substantially reduced), and a programming current required to store data may be reduced (e.g., substantially decreased). Also, data integrity may be more efficiently improved through a process of re-recording recorded data by using a phase-change material having relatively low crystallization temperature as a storage node.

A PRAM as illustrated in FIGS. 1 and 2 may be applied to memory systems, computing systems, semiconductor memory devices, etc. Hereinafter, various example embodiments including a PRAM will be described with reference to FIGS. 5 through 23.

Figure 5:
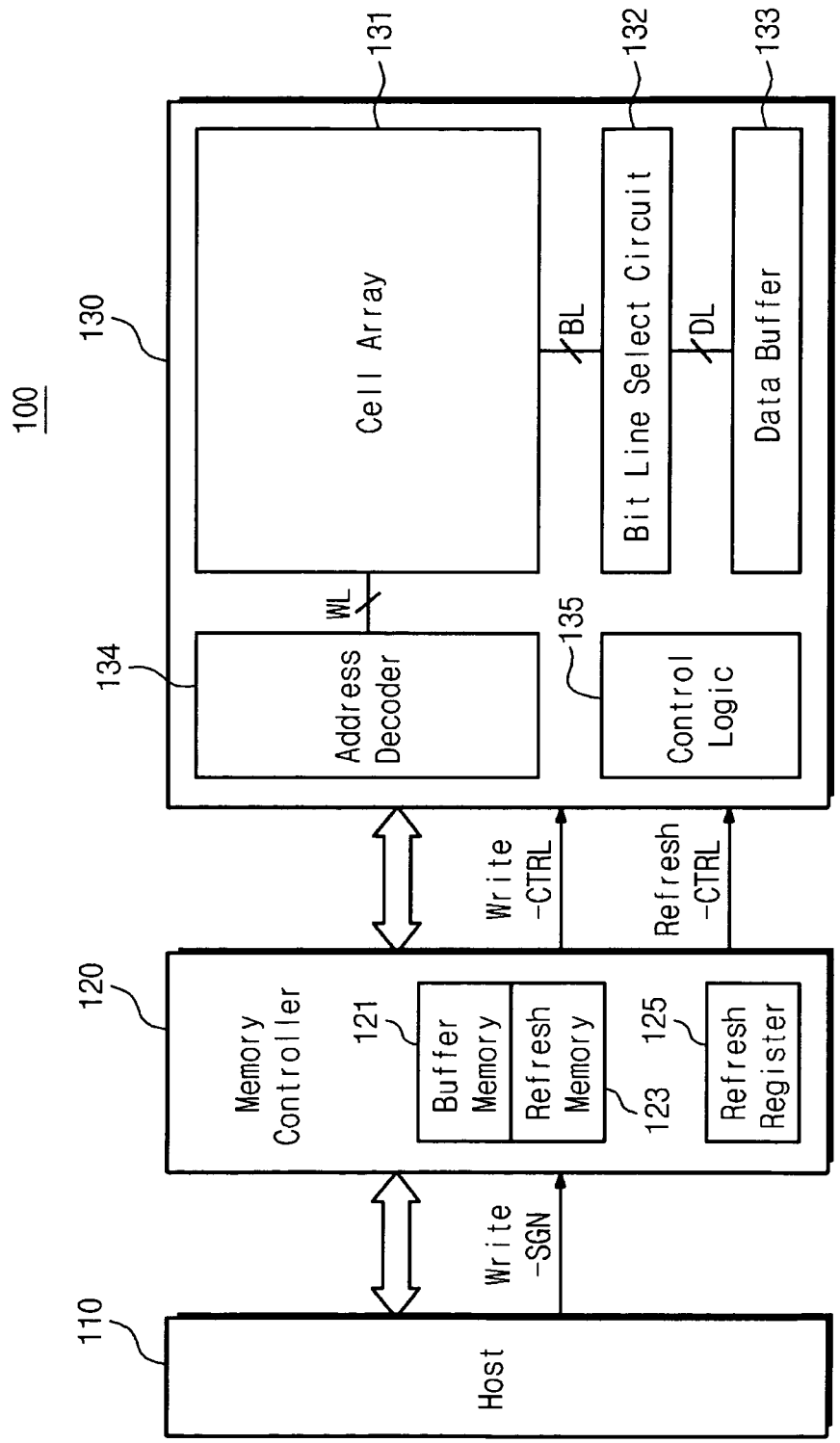
FIG. 5 is a block diagram illustrating a memory system in accordance with an example embodiment of inventive concepts.

FIG. 5 is a block diagram illustrating a memory system in accordance with an example embodiment of inventive concepts.

Referring to FIG. 5, a memory system 100 includes a host 110, a memory controller 120 and a nonvolatile memory device 130.

The host 110 is connected to the memory controller 120. The host 110 receives data stored in the nonvolatile memory device 130 through the memory controller 120. The host 110 also transmits data to the nonvolatile memory device 130 through the memory controller 120. In this example, the host 110 generates data writing commands (Write_SGN), which will be described in more detail later with regard to FIG. 7.

Still referring to FIG. 5, the memory controller 120 is connected to the nonvolatile memory device 130. The memory controller 120 includes a buffer memory 121, a refresh memory 123 and a refresh register 125.

The buffer memory 121 stores (e.g., temporally or temporarily stores) data from the host 110 that is to be written in the nonvolatile memory device 130. Data transmitted to the buffer memory 121 is written in a memory cell array 131 through a data buffer 133.

The buffer memory 121 also stores (e.g., temporally or temporarily stores) data read from the nonvolatile memory device 130. For example, the data buffer 133 transmits data read from the memory cell array 131 to the buffer memory 121. The buffer memory 121 transmits data from the data buffer 133 to the host 110.

The refresh memory 123 stores (e.g., temporally or temporarily stores) data read from the memory cell array 131. In at least one example embodiment, the refresh memory 123 stores data from a sector of the memory cell array 131.

The refresh register 125 stores refresh information for the memory cell array 131. In at least one example embodiment, the refresh register 125 stores location information regarding a sector where a refresh operation is performed. The refresh memory 123 and the refresh register 125 are utilized in performing a refresh operation.

Still referring to FIG. 5, the memory controller 120 generates writing control signals (Write_CTRL) for transmitting data from the host 110 to the nonvolatile memory device 130. The memory controller 120 also generates refresh control signals (Refresh_CTRL) for refreshing data stored in a target sector. Here, the target sector refers to the sector in which a refresh operation is performed.

Still referring to FIG. 5, the nonvolatile memory device 130 includes the memory cell array 131, a bit line select circuit 132, the data buffer 133, an address decoder 134 and control logic 135.

The memory cell array 131 includes a plurality of memory cells for storing data. The memory cell array 131 includes a given, desired or predetermined number of sectors. In one example, the number of sectors is determined according to a disturb characteristic of the memory cell.

The bit line select circuit 132 is connected to the memory cell array 131 through bit lines (BL). The bit line select circuit 132 selects a bit line under the control of the address decoder 134 such that the bit line select circuit 132 selects a bit line corresponding to a sector of the memory cell array 131.

The data buffer 133 is connected to the bit line select circuit 132 through data lines (DL). The data buffer 133 stores data transmitted from the memory controller 120 in the memory cell array 131. The data buffer 133 also transmits data read from the memory cell array 131 to the memory controller 120.

Referring still to FIG. 5, the address decoder 134 is connected to the memory cell array 131 through word lines WL. The address decoder 134 includes a row decoder (not illustrated) and a column decoder (not illustrated). The row decoder receives a row address (RA) from the memory controller 120, decodes the row address (RA), and selects a word line (WL) of the memory cell array 131 according to the decoded row address. The column decoder receives a column address (CA) from the memory controller 120, decodes the column address (CA), and controls the bit line select circuit 132 according to the decoded column address.

The address decoder 134 receives an address from the memory controller 120 to select a target sector.

The control logic 135 receives a control signal (CTRL) from the outside (e.g., an external device or unit) and controls operations of the nonvolatile memory device 100 in response to the control signal (CTRL).

In one example, the non-volatile memory device 130 may be a Low Power Double Data Rate 2 (LPDDR2) memory device. In this example, the memory controller 120 may be coupled to the LPDDR2 memory device and configured to control the LPDDR2 memory device.

Figure 6:
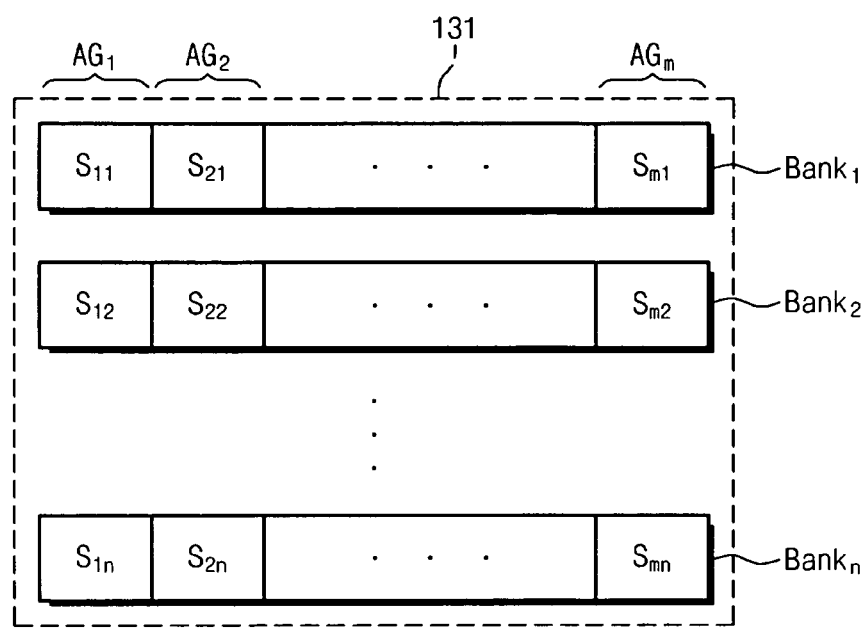
FIG. 6 is a block diagram illustrating an example embodiment of the memory cell array illustrated in FIG. 5.

FIG. 6 is a block diagram illustrating an example embodiment of the memory cell array illustrated in FIG. 5.

Referring to FIG. 6, the memory cell array 131 includes a plurality of sectors. Each of the sectors includes a plurality of memory cells to store data. One or more of the plurality of memory cells may include a PRAM as illustrated in FIGS. 1 and 2, for example. Accordingly, when N (where N is a positive integer) memory cells are programmed, a program current may be less than or equal to about 0.75 mA*N.

For the following description, it is assumed that the memory cell array 131 includes a plurality of address groups (AG). In this example, a collection of memory cells corresponding to the bit line selected by the bit line select circuit 132 is referred to as an address group (AG). It is also assumed that the memory cell array 131 includes a plurality of banks. In this case, a collection of memory cells corresponding to the word line selected by the address decoder 134 is referred to as a bank (Bank). A collection of memory cells corresponding to each of the address group (AG) and each of the banks (Bank) is referred to as a sector. As an illustration, a collection of memory cells corresponding to a first address group ($AG_1$) and a first bank ($Bank_1$) is referred to as a sector ($S_{11}$). It is assumed that a memory cell array includes 'm×n' number of sectors.

The memory cell array 131 includes a plurality of sectors $S_{11}$~$S_{mn}$. In one example, the number of sectors is determined by a disturb characteristic of a memory cell, which provides (e.g., guarantees) at least one repetition of a refresh operation before changing data stored in a memory cell of the memory cell array 131. As a result, data-retention characteristics and/or reliability of the nonvolatile memory device may be improved.

It is also assumed that the memory cell array 131 includes a plurality of phase change memory cells (PRAMs). As discussed above, a phase change memory cell has a resistance, which varies according to an applied temperature. As an illustration, phase change memory cells include a chalcogen compound of which a resistance varies according to an applied temperature.

If a temperature higher than a melting temperature of a chalcogen compound is applied to the chalcogen compound for a relatively short time, the chalcogen compound transitions to an amorphous state. If a temperature lower than a melting temperature of a chalcogen compound is applied to a chalcogen compound for a relatively long time, the chalcogen compound transitions to a crystalline state. In one example, a resistance of a chalcogen compound in the crystalline state is lower than a resistance of a chalcogen compound in the amorphous state because the portion of the chalcogen compound in an amorphous state is relatively large. A phase change memory device stores data by transitioning a chalcogen compound to a crystalline state or an amorphous state.

A chalcogen compound transitions between a crystalline state and an amorphous state in response to heat generated by current flowing through a memory cell. For example, when performing a data writing operation, a write current is provided to a phase change memory cell through a bit line. Because joule heat generated by the write current is proportional to the square of the write current, heat sufficient to transition a state of the chalcogen compound is provided to a phase change memory cell.

In this example, memory cells adjacent to the memory cell (hereinafter, a target memory cell) in which data is written may be affected by the joule heat, for example, because the target memory cell and adjacent memory cells are connected to a common bit line through an upper electrode or a lower electrode. If a write current is applied to the target memory cell, joule heat is generated in the target memory cell and may be transmitted to memory cells adjacent to the target memory cell through the bit line. As a result, resistances of adjacent memory cells may be changed. Also, reliability of data stored in a phase change memory cell may be degraded.

Memory systems according to at least some example embodiments may improve reliability of memory cells adjacent to a target memory cell by performing a refresh operation on sectors of the memory cell array. More specifically, for example, memory systems may perform a refresh operation on each sector each time a writing command (Write_SGN) is provided from a host.

As an example illustration, assume that a chalcogen compound of an adjacent phase change memory cell transitions from a crystalline state to an amorphous state after about 1000 data writing operations are performed consecutively on the same memory cell. In this case, data stored in an adjacent memory cell may undergo an unintended change.

In this example, the memory cell includes about 1000 sectors and when a data writing command is provided from the host, one sector is refreshed in response to one data writing command.

Also, a refresh operation is performed in a given, desired or predetermined order. In one example, a refresh operation may be performed sequentially, but is not limited thereto. Assuming that a refresh operation is performed sequentially, the refresh operation is performed on a first sector ($S_{11}$) in response to a first data write request, then a refresh operation is performed on a second, subsequent sector ($S_{21}$) in response to a second data write request, etc.

According to at least this example, when about 1000 writing commands are provided, a refresh operation is sequentially performed on about 1000 sectors. Thus, when about 1000 data writing commands are provided, a refresh operation is performed on all or substantially all phase change memory cells of the memory cell array 131.

According to the method described above, data retention characteristics of memory cells may be improved because at least one refresh operation is performed on all or substantially all of the memory cells. The above-description is, however, only an illustration. Alternatively, for example, memory cells of the memory cell array 131 may be flash memory cells, ferroelectric random access memory (FRAM) cells, magnetoresistive random access memory (MRAM) cells, resistive random access memory (RRAM) cells, etc.

According to at least some example embodiments, the number of sectors of the memory cell array 131 may be set by another standard such as by an external condition. For example, the number of sectors may be set according to the durability of the target memory cell.

A refresh operation may be performed by a reprogram method. In an example reprogram method, data read from a target sector is stored in memory cells of the target sector.

Figure 7:
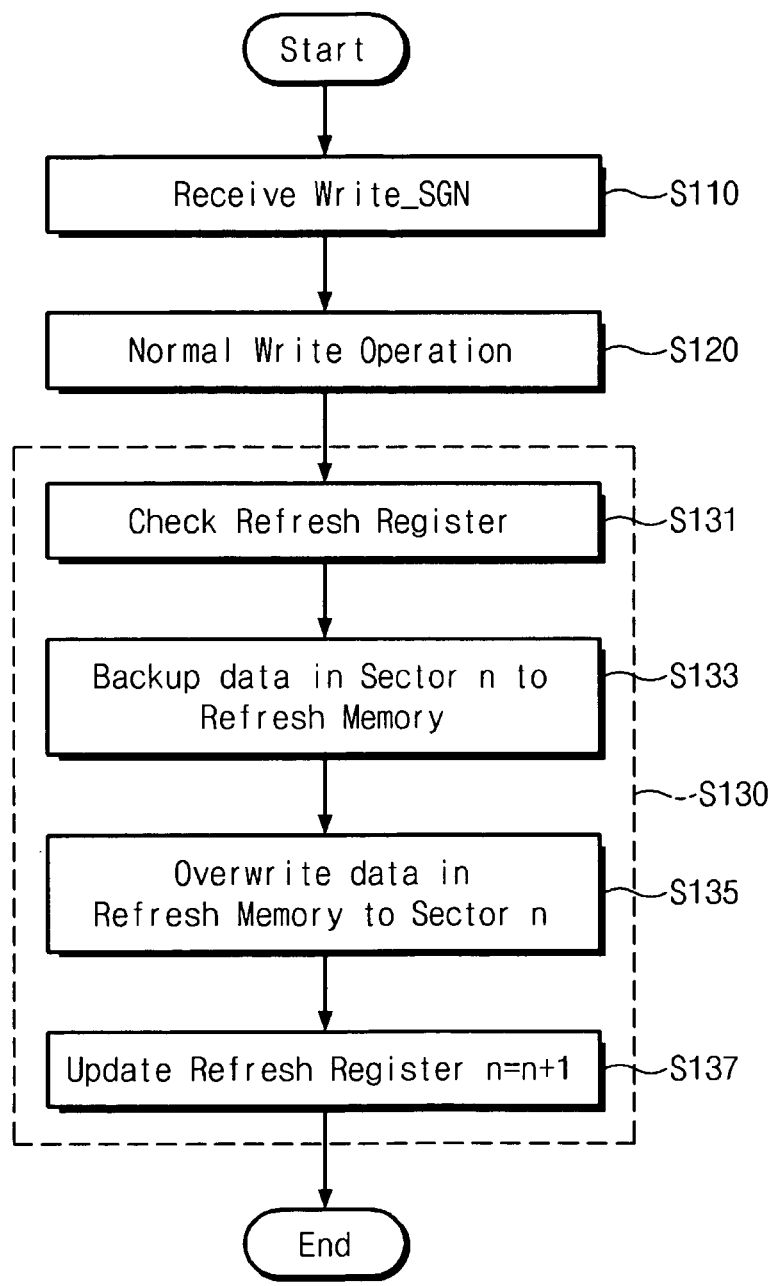
FIG. 7 is a flow chart illustrating an example embodiment of a refresh method for the memory system illustrated in FIG. 5.

FIG. 7 is a flow chart illustrating an example embodiment of a refresh method for the memory system illustrated in FIG. 5.

The method shown in FIG. 7 will be described with regard to FIGS. 5 and 6. For the sake of this description, it is assumed that a refresh operation is performed after performing a normal write operation. Also, it is assumed that refresh operations are performed sequentially.

Referring to FIG. 7, at S110 the host 110 provides a data writing command (Write_SGN) to the memory controller 120. In response to the data writing command (Write_SGN), the memory controller 120 generates a writing control signal (Write_CTRL) for performing a normal writing operation, which will be described in more detail with regard to S120.

Also in response to the data writing command (Write_SGN), the memory controller 120 generates a refresh control signal (Refresh_CTRL) for performing a normal refresh operation, which will be described in more detail with regard to S130.

At S120 in FIG. 7, a normal write operation is performed. In one example, the memory controller 120 receives data from the host 110, and stores the received data in the buffer memory 121. The memory controller 120 transmits a writing control signal (Write_CTRL) to the nonvolatile memory device 130 for writing the data stored in the buffer memory 121 to the memory cell array 131.

The control logic 135 controls the nonvolatile memory device 130 in response to the writing control signal (Write_CTRL) so that the data stored in the buffer memory 121 is stored in the memory cell array 131. For example, the control logic 135 controls the nonvolatile memory device 130 so that the data stored in the buffer memory 121 is stored in the memory cell array 131.

Still referring to FIG. 7, at S130 a refresh operation is performed. For the following description, it is assumed that refresh operations are performed sequentially.

At S131, location information for a sector where a refresh operation is completed is checked. The location information is stored in the refresh register 125. For example, the memory controller 120 checks an address of a sector ($S_{11}$) stored in the refresh register 125. The memory controller 120 generates a refresh control signal (Refresh_CTRL) so that a refresh operation is performed on the target sector ($S_{21}$), which is subsequent to the sector ($S_{11}$) where the refresh operation is complete. In this case, the refresh control signal (Refresh_CTRL) includes an address signal (not illustrated) with respect to the target sector ($S_{21}$).

At S133, data from the target sector is stored (e.g., temporally or temporarily stored) in the refresh memory 123. For example, the control logic 135 receives the refresh control signal (Refresh_CTRL) from the memory controller 120, and the control logic 135 controls the nonvolatile memory device 130 to perform a read operation for a refresh operation.

In this example, the control logic 135 controls the address decoder 134 to read data stored in the target sector ($S_{21}$). The address decoder 135 selects the target sector ($S_{21}$) in response to the control logic 135 and an address signal (not illustrated). Data stored in the target sector ($S_{21}$) is stored in the refresh memory 123 through the data buffer 133.

At S135, the data stored in the refresh memory 123 is again stored in the target sector ($S_{21}$). In one example, the memory controller 120 generates the refresh control signal (Refresh_CTRL) so that the data from the refresh memory 123 is again stored in the target sector ($S_{21}$). The refresh control signal (Refresh_CTRL) may include a sub writing control signal (sub_write_CTRL) to write data in the target sector ($S_{21}$).

The control logic 135 controls the nonvolatile memory device 130 in response to the refresh control signal (Refresh_CTRL) so that the data from the refresh memory 123 is stored in the target sector ($S_{21}$).

At S137, location information for a sector where a refresh operation is completed is renewed. The location information is stored in the refresh register 370. For example, when a refresh operation with respect to the target sector ($S_{21}$) is completed, address information on the target sector ($S_{21}$) is stored in the refresh register 370.

Afterward, it is assumed that a data writing command is provided from the host 110. In this case, a refresh operation is performed again by the process described above, but the target sector is now sector ($S_{31}$), which is subsequent to the sector ($S_{21}$).

A refresh operation may be performed on sectors included in the memory cell array 131 by the method described above. Referring to FIGS. 5 through 7, for example, when m×n data writing commands are provided from the host 110, all or substantially all sectors of the memory cell array 131 are refreshed at least once according to a given, desired or predetermined order. Thus, data retention characteristics of the memory cell array 131 may be improved. In one example, each time a data writing command is provided from the host 110, a sector of the memory cell array 131 is refreshed such that all sectors of the memory cell array 131 are refreshed once according to a given, desired or predetermined order when m×n data writing commands are provided from the host 110.

Once a refresh operation is performed on all or substantially all sectors of the memory cell array 131, a refresh operation is again performed on the first sector ($S_{11}$). For example, when a data writing command is provided from the host 110 after a refresh operation is performed on a sector ($S_{mn}$), a refresh operation is performed on the first sector ($S_{11}$).

The above-described refresh operation is only an illustration. For example, a refresh operation may be performed after performing a normal writing operation. Also, location information on the target sector stored in the refresh register may be renewed after data stored in the target sector is stored in the refresh register.

Figure 8:
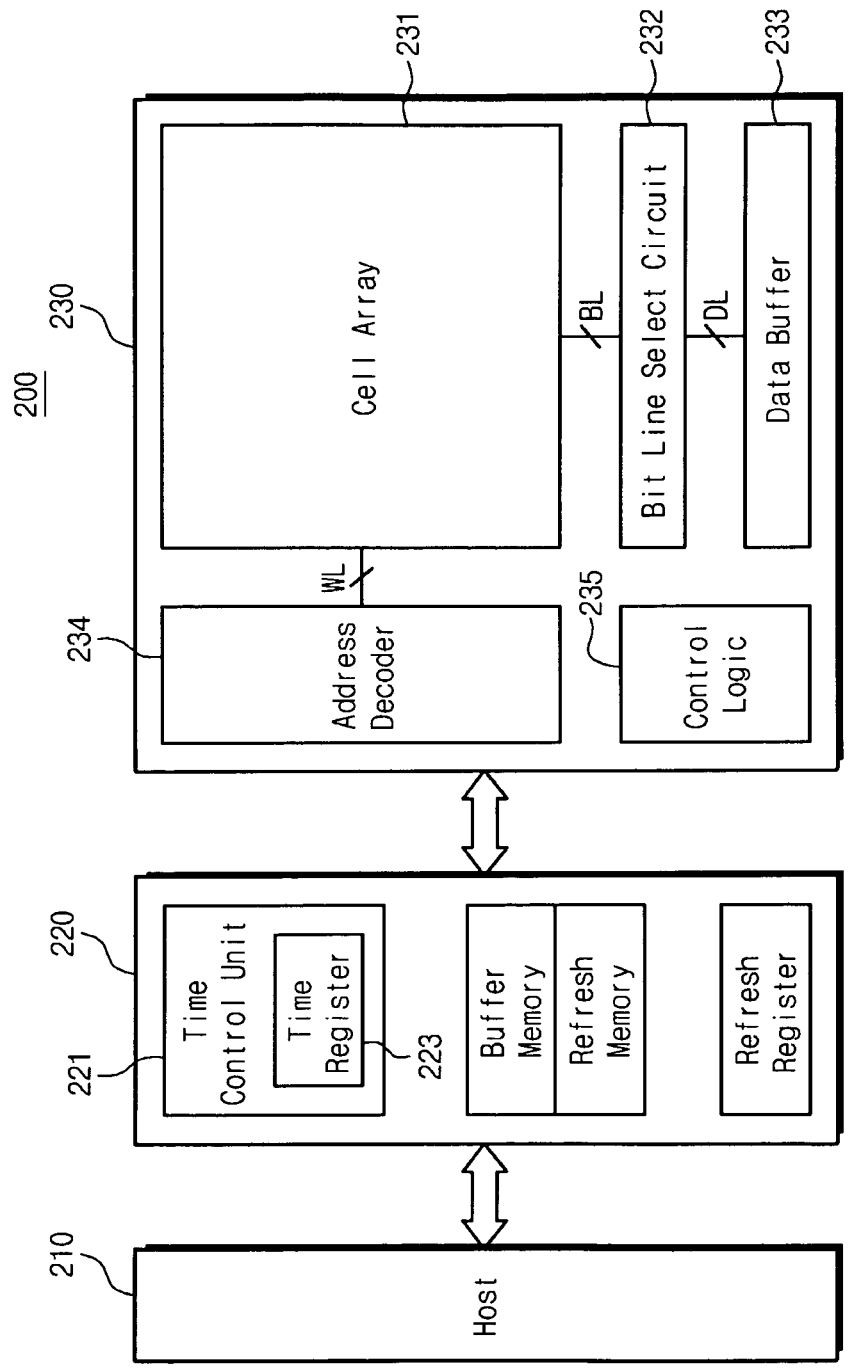
FIG. 8 is a block diagram illustrating a memory system in accordance with another example embodiment of inventive concepts.

FIG. 8 is a block diagram illustrating a memory system in accordance with another example embodiment of inventive concepts.

Referring to FIG. 8, a memory system 200 includes a host 210, a memory controller 220 and a nonvolatile memory device 230. The memory controller 220 includes a time control unit 221, which further includes a time register 223. The nonvolatile memory device 230 includes a cell array 231. The cell array 231 may include a plurality of memory cells as illustrated in FIGS. 1 and 2, for example.

The time control unit 221 controls the memory system 200 so that a refresh operation is performed when a reference time elapses. The time register 223 controls time information regarding when a refresh operation with respect to all or substantially all sectors of the memory cell array 231 is completed.

An operation of the memory stem 200 of FIG. 8 is similar to the operation of the memory system 100 of FIG. 5. Thus, a description of FIG. 8 will be focused on the time control unit 221, which is a difference between the example embodiments shown in FIGS. 5 and 8. For a brief description, it is assumed that refresh operations are performed sequentially.

Referring to FIG. 8, a refresh operation is sequentially performed on all or substantially all sectors. When a refresh operation with respect to a sector ($S_{mn}$) is completed, a refresh operation of one cycle with respect to all or substantially all sectors of the memory cell array is complete.

A time for completion of a refresh operation of one cycle is referred to as a refresh cycle completion time. The time register 223 stores refresh cycle completion time information.

For example, the time register 223 stores time information of when a refresh operation with respect to a sector ($S_{mn}$) is completed.

The time control unit 221 may be configured to store the current time information when the memory system 200 powers up. The current time information may be provided from the outside (e.g., a host, an external timer, etc.). The time control unit 221 may also be configured to store reference time information. In this example, reference time information represents a quantity (e.g., hour) of time such as one day, one week, one month, two months and so on. The time control unit 221 may include registers for storing the current time information and the reference time information.

The time control unit 221 calculates a time difference by comparing completion time information of a refresh cycle with the current time information. The time control unit 221 then compares the calculated time difference with the reference time information to determine whether to perform a refresh operation. For example, assuming that the reference time information is two months, if a difference between refresh cycle completion time information and the current time information is less than two months, a refresh operation is not performed.

According to at least some example embodiments, the time control unit 221 compares refresh cycle completion time information with the current time information and controls the memory system 200 so that a refresh operation is performed if a difference between the refresh cycle completion time information and the current time information is greater than the reference time.

If a difference between refresh cycle completion time information and the current time information is greater than the reference time, a refresh operation is performed. In a more specific example, if a difference between refresh cycle completion time information and the current time information is greater than the reference time, a refresh operation with respect to sectors of the memory cell array 231 is performed in response to a data writing request received from the host 210. Because these refresh operations are similar to the refresh operations described with regard to FIG. 5, a detailed description is omitted. A refresh operation continues until a refresh operation of one cycle is completed.

When a refresh operation of one cycle is completed, the time register 223 stores new refresh cycle completion time information. In this case, the time control unit 221 determines whether to perform a refresh operation by comparing the new refresh cycle completion time information with the reference time information.

According to the method described above, a refresh operation may be performed at a regular time interval (e.g., periodically). By performing a refresh operation with respect to one cycle at a regular time interval, memory system performance may be improved.

The reference time may be variously defined. In one example, the reference time is set to be shorter than a guarantee time of memory cells of the memory cell array. In this case, the guarantee time is a time during which a data retention characteristic stored in a memory cell is not changed by a disturbance. In another example, the reference time is set by considering the guarantee time of memory cells of the memory cell array and the number of memory sectors. As the number of memory sectors increases, the reference time may decrease.

The time control unit 221 shown in FIG. 8 is only an illustration.

Still referring to FIG. 8, the control logic 235 may be configured to store the current time, and the nonvolatile memory device 230 may be configured to store refresh cycle completion time information.

The non-volatile memory device 230 may be a LPDDR2 memory device. In this case, the memory controller 220 may be coupled to the LPDDR2 memory device and configured to control the LPDDR2 memory device.

Figure 9:
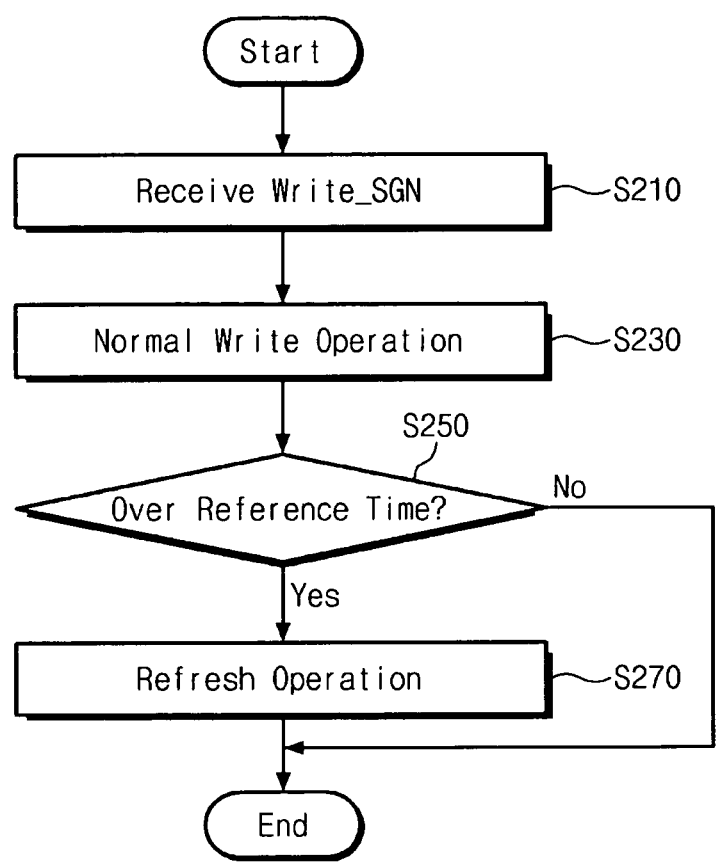
FIG. 9 is a flow chart illustrating an example embodiment of a refresh method for the memory system illustrated in FIG. 8.

FIG. 9 is a flow chart illustrating an example embodiment of a refresh method for the memory system illustrated in FIG. 8.

Referring to FIG. 9, at S210 the host 210 transmits a data writing command (Write_SGN) to the memory controller 220. Because an operation of the memory system 200 at S210 is similar or substantially similar to the operation of the memory system 100 described above with regard to S110 in FIG. 7, a detailed description is omitted.

At S230, a normal writing operation is performed. Because operations of the memory system 200 at S230 are similar or substantially similar to the operations performed at S120 in FIG. 7, a detailed description is omitted.

At S250, whether a difference between the refresh cycle completion time and the current time is greater than the reference time is determined. If a refresh operation of one cycle is completed, refresh cycle completion time information is stored in the time register 223. The current time information of when the memory system 200 powers up is stored in the time control unit 221.

The time control unit 221 calculates the difference between the refresh cycle completion time and the current time. If the calculated time difference is greater than or equal to the reference time, a refresh operation is performed at S270. Because the operations performed at S270 are similar or substantially similar to the operations performed at S130 in FIG. 7, a detailed description is omitted.

Returning to S250, if the calculated time difference is less than the reference time, a refresh operation is not performed.

According to the method described above with regard to FIG. 9, a refresh operation may be performed at a regular time interval. For example, a refresh operation with respect to one cycle may be performed at a regular time interval. As a result, memory system performance may improve.

Figure 10:
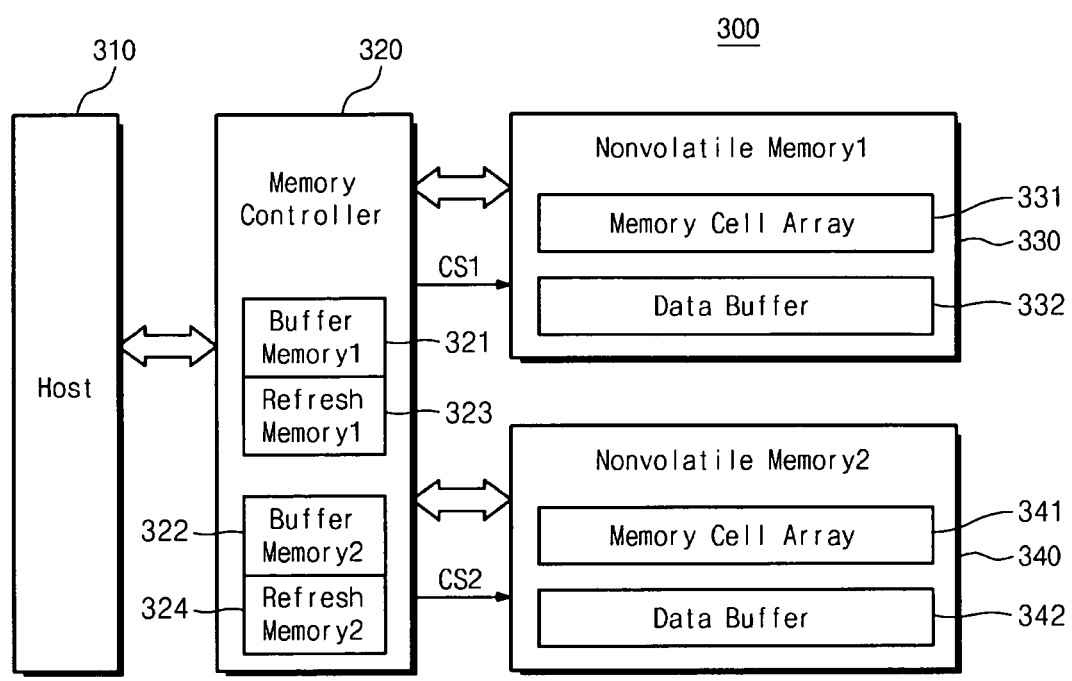
FIG. 10 is a block diagram illustrating a memory system in accordance with still another example embodiment of inventive concepts.

FIG. 10 is a block diagram illustrating a memory system in accordance with still another example embodiment of inventive concepts.

Referring to FIG. 10, a memory system 300 includes a host 310, a memory controller 320, a first nonvolatile memory device 330 and a second nonvolatile memory device 340. The memory controller 320 includes first and second buffer memories 321 and 322. The memory controller 320 also includes first and second refresh memories 323 and 324.

The first and second buffer memories 321 and 322 store data in the first and second nonvolatile memory devices 330 and 340, respectively. The first and second refresh memories 323 and 324 perform refresh operations on the first and second nonvolatile memory devices 330 and 340, respectively.

The first nonvolatile memory device 330 includes a memory cell array 331 and a data buffer 332. The second nonvolatile memory device 340 includes a memory cell array 341 and a data buffer 342. But, this structure is only an illustration and structures of the first and second nonvolatile memory devices 330 and 340 may be similar or substantially similar to those described in FIGS. 5 and 8. The memory cell arrays 331 and/or 341 may include a plurality of memory cells and the plurality of memory cells may include PRAM cells as illustrated in FIGS. 1 and 2, for example.

The first and second nonvolatile memory devices 330 and 340 are selected by first and second chip select signals (CS1, CS2), respectively. More specifically, the first nonvolatile memory device 330 is selected by the first chip select signal (CS1), whereas the second nonvolatile memory device 340 is selected by the second chip select signal (CS2).

An example embodiment of a process of performing a refresh operation in the memory system 300 of FIG. 10 will now be described in more detail. For the following description, it is assumed that a refresh operation with respect to the first nonvolatile memory device 330 is performed first, and then a refresh operation with respect to the second nonvolatile memory device 340 is performed.

Referring to FIG. 10, when a data writing command (Write_SGN) is provided from the host 310, data transmitted from the host 310 is stored in the first buffer memory 321. The first nonvolatile memory device 330 is then activated by the first chip select signal (CS1). In this example, data in the first memory buffer 321 is stored in the memory cell array 331 of the first nonvolatile memory device 330. Data in a sector of the first nonvolatile memory device 330 is refreshed using the first refresh memory 323. Because the refresh process is similar or substantially similar to the method described above with regard to FIGS. 5 and 8, a detailed description is omitted.

Still referring to FIG. 10, if a data writing request is again provided from the host 310, data transmitted from the host 310 is stored in the second buffer memory 322. The second nonvolatile memory device 340 is then activated by the second chip select signal (CS2). The refresh operation for the second nonvolatile memory device 340 is the same or substantially the same as the refresh operation of the first nonvolatile memory device 330. The refresh operation of the second nonvolatile memory device 340 is performed using the second refresh memory 324.

According to the method described above, two nonvolatile memory devices may be controlled by one memory controller 320. But, this is only an illustration and more than two nonvolatile memory devices may be controlled by one memory controller.

Moreover, the structure of the memory controller 320 of FIG. 10 is only an illustration. For example, the memory controller 320 of FIG. 10 may include a time control unit and the structure of the memory controller 320 of FIG. 10 may be similar or substantially similar to a structure of the memory controller 220 shown in FIG. 8.

The first and second non-volatile memory devices 330 and 340 may be a LPDDR2 memory device. In this case, the memory controller 320 may be coupled to the LPDDR2 memory device and configured to control the LPDDR2 memory device.

Figure 11:
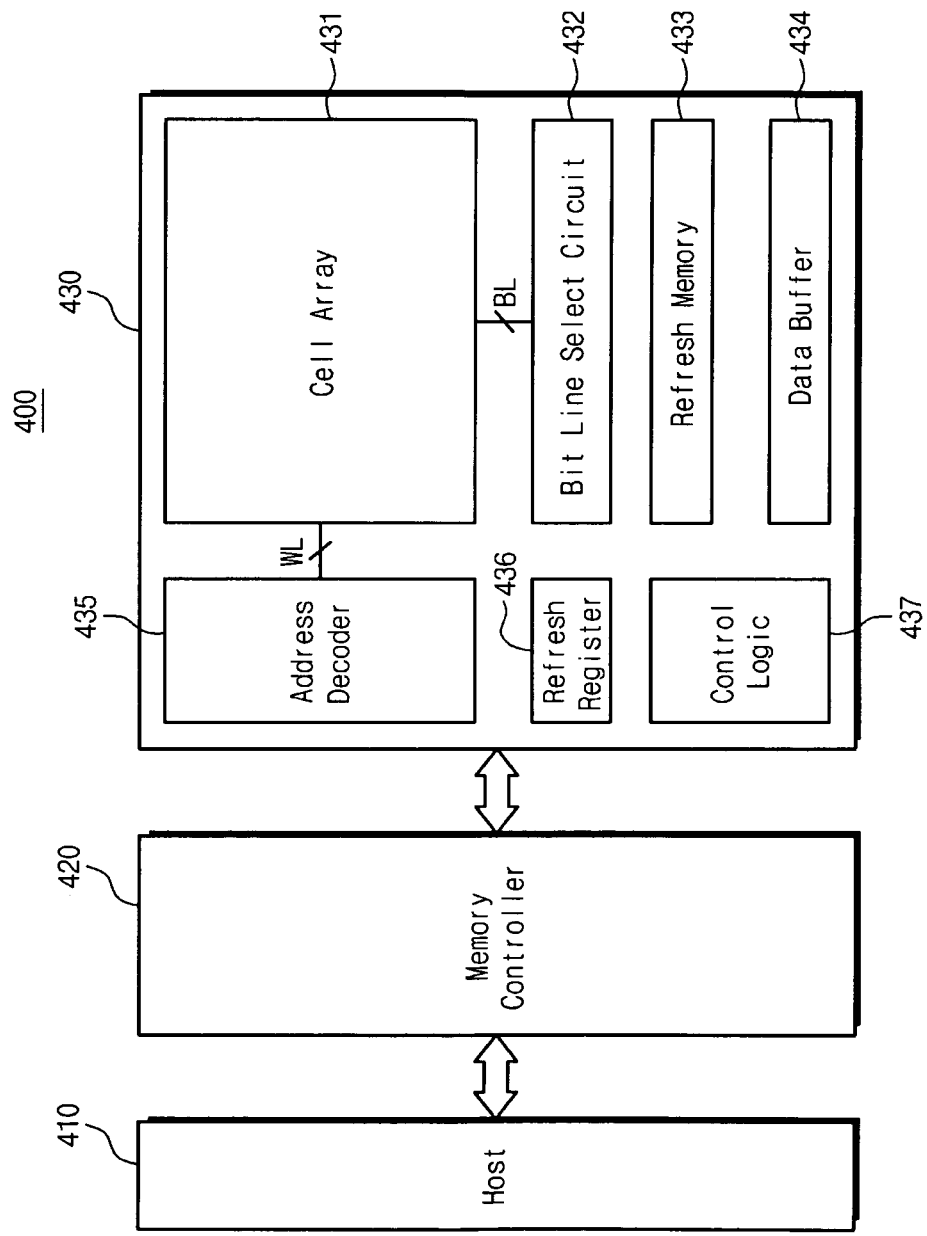
FIG. 11 is a block diagram illustrating a memory system in accordance with yet another example embodiment of inventive concepts.

FIG. 11 is a block diagram illustrating a memory system in accordance with yet another example embodiment of inventive concepts.

Referring to FIG. 11, a memory system 400 includes a host 410, a memory controller 420 and a nonvolatile memory device 430. The nonvolatile memory device 430 includes a memory cell array 431, a bit line select circuit 432, a refresh memory 433, a data buffer 434, an address decoder 435, a refresh register 436 and control logic 437. The memory cell array 431 may include a plurality of memory cells and the plurality of memory cells may include PRAM cells as illustrated in FIGS. 1 and 2, for example.

An example operation of the memory system 400 of FIG. 11 is similar or substantially similar to the operation of the memory system 100 of FIG. 5. Thus, the following description focuses on operational differences between the memory system 400 of FIG. 11 and the memory system 100 of FIG. 5.

For the following description, it is assumed that a refresh operation is performed sequentially. Referring back to FIG. 6, for example, it is assumed that a refresh operation is sequentially performed from sector ($S_{11}$) to sector ($S_{mn}$).

As shown in FIG. 11, when a data writing command (Write_SGN) is provided from the host 410, the memory controller 420 transmits a writing control signal (Write_CTRL) to the nonvolatile memory device 430. The control logic 437 stores data transmitted from the host 410 in the memory cell array 431 in response to the writing control signal (Write_CTRL). Because this process is described in detail above with regard to FIGS. 5 and 7, a detailed description is omitted.

The control logic 437 also controls the nonvolatile memory device 430 in response to the writing control signal (Write_CTRL) to perform a refresh operation on a target sector ($S_{11}$). For example, the control logic 437 controls the nonvolatile memory device 430 to store (e.g., temporally or temporarily store) data from the target sector ($S_{11}$) in the refresh memory 433. The data stored in the refresh memory 433 is again stored in the target sector ($S_{11}$). The control logic 437 controls the nonvolatile memory device 430 to store the data stored in the refresh memory 433 in the target sector ($S_{11}$).

The refresh register 436 stores location information for the target sector ($S_{11}$) where a refresh operation is performed. For example, the control logic 436 controls the nonvolatile memory device 430 to store, in the refresh register 436, location information for the sector ($S_{11}$) where a refresh operation is performed.

When a data writing command is again provided from the host, the control logic 437 determines location information for the sector where a refresh operation is performed. The location information is stored in the refresh register 436. The control logic 437 controls the nonvolatile memory device 430 so that a refresh operation is performed on a next one of the sectors. For example, the control logic 437 controls the nonvolatile memory device 430 so that a refresh operation is performed on a next sector ($S_{21}$).

According to the method described above, a refresh operation may be performed on sectors included in the memory cell array 431. Referring back to FIG. 6, for example, when m×n data writing commands are provided from the host 410, all or substantially all sectors of the memory cell array 431 are refreshed at least once according to a given, desired or predetermined order. In one example, a sector of the memory cell array 431 is refreshed each time a data writing command is received from the host 410 such that all or substantially all sectors of the memory cell array 431 are refreshed once. Thus, a data retention characteristic of the memory cell array 431 may be improved.

The structure of the memory system 400 shown in FIG. 11 is only an illustration. According to at least some example embodiments, the memory controller 420 may include a time control unit as described above with regard to FIG. 8. In this case, the structure of the memory controller 420 of FIG. 11 may be similar or substantially similar to the structure of the memory controller 220 of FIG. 8.

The non-volatile memory device 430 may be a LPDDR2 memory device. In this case, the memory controller 420 may be coupled to the LPDDR2 memory device and configured to control the LPDDR2 memory device.

Figure 12:
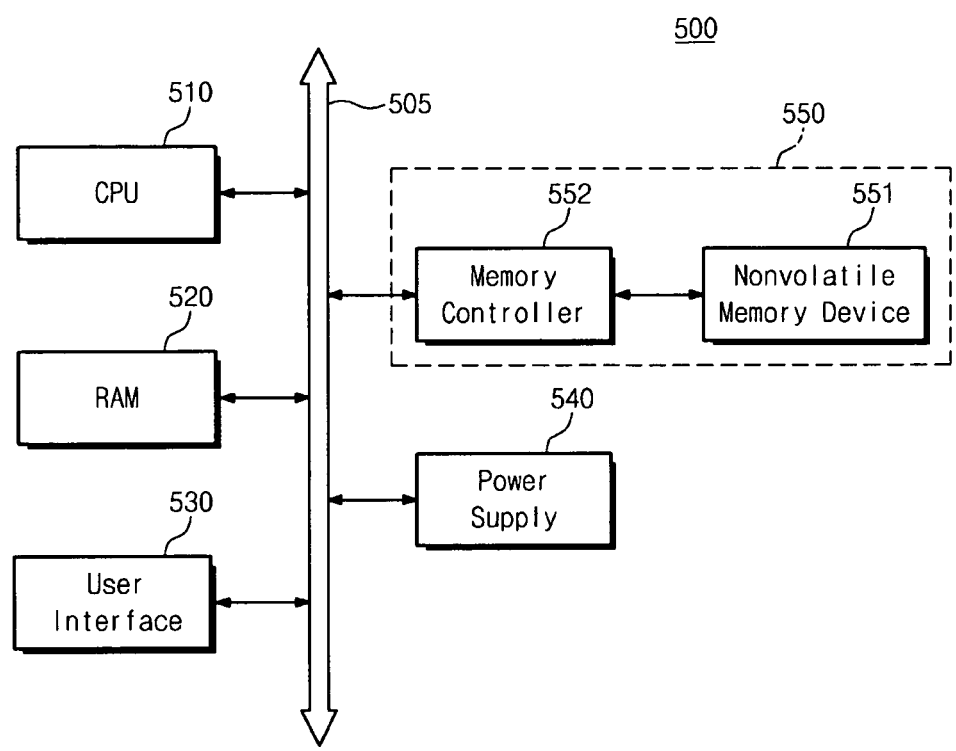
FIG. 12 is a block diagram illustrating a computing system including a memory system in accordance with an example embodiment.

FIG. 12 is a block diagram illustrating a computing or electronic system including a memory system according to an example embodiment.

Referring to FIG. 12, a computing system 500 includes a central processing unit (CPU) 510, a random access memory 520 (RAM), a user interface 530, a power supply 540 and a memory system 550.

The memory system 550 is electrically connected to the central processing unit 510, the random access memory (RAM) 520, the user interface 530 and the power supply 540 through a system bus 505. Data provided through the user interface 530 or processed by the central processing unit 510 is stored in the memory system 550. The memory system 550 includes a memory controller 552 and a nonvolatile memory device 551. The non-volatile memory device 551 may include a PRAM as illustrated in FIGS. 1 and 2, for example. In the drawings, the nonvolatile memory device 551 is connected to the system bus 505 through the memory controller 552. However, in at least one other example embodiment, the nonvolatile memory device 551 may be directly connected to the system bus 505.

If the memory system 550 is a solid state drive (SSD), a booting speed of the computing system 500 may be improved (e.g., greatly improved). Although not illustrated in the drawing, systems in accordance with example embodiments of inventive concepts may further include an application chipset, a camera image processor and so on.

The memory system in accordance with at least this example embodiment performs a refresh operation each time a writing command is received from the host. As a result, reliability of data stored in the memory cell array may be improved.

Figure 13A:
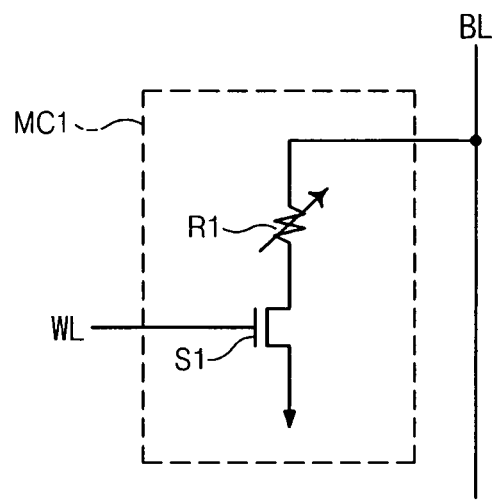
FIG. 13A and FIG. 13B are circuits illustrating a unit memory cell of a variable change memory device according to an example embodiment of inventive concepts.
Figure 13B:
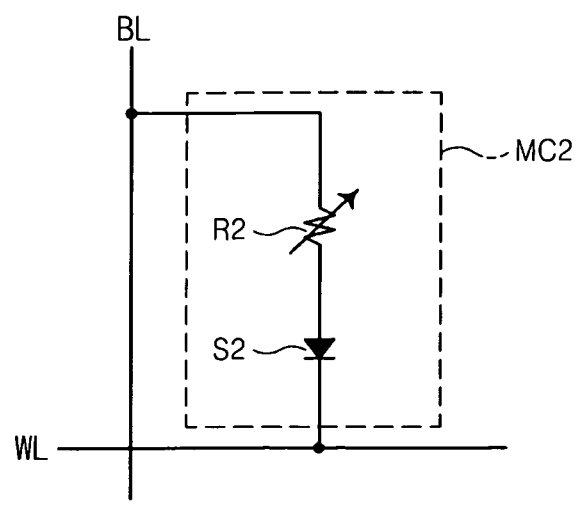
Figure 14:
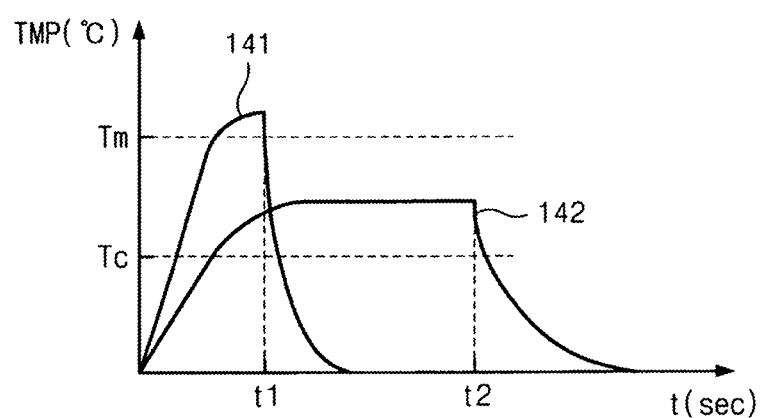
FIG. 14 is a graph illustrating example characteristics of a variable resistance material according to an example embodiment of inventive concepts.

FIGS. 13A and 13B are circuits illustrating a unit cell (also referred to herein as a unit memory cell or memory cell) of a semiconductor memory device in accordance with example embodiments of inventive concepts. FIG. 14 is a graph illustrating example characteristics of a variable resistance material illustrated in FIGS. 13A and 13B.

An example embodiment of a unit cell of a semiconductor memory device is described with regard to FIGS. 13A and 13B. The unit cell of FIGS. 13A and/or 13B may be implemented, for example, as a PRAM illustrated in FIGS. 1 and 2.

Referring to FIG. 13A, a unit cell MC1 includes a variable resistance device R1 and a select device S1. The variable resistance device R1 is connected between a bit line (BL) and the select device S1. The select device S1 is connected between the variable resistance device R1 and ground.

The variable resistance device R1 includes a phase change material (e.g., GST (Ge—Sb—Te)) having a resistance that changes according to temperature. A phase change material has an amorphous state in which a resistance is relatively high and a crystalline state in which a resistance is relatively low. A state of the variable resistance device R1 is determined by the quantity of a current supplied through the bit line (BL).

The select device S1 may be a transistor such as an NMOS or PMOS transistor. In one example, a word line (WL) is connected to a gate of the NMOS transistor, and a current supply to the variable resistance device R1 is controlled according to a voltage of the word line (WL). Although the select device S1 is connected between the variable resistance device R1 and ground in FIG. 13A, the select device S1 may be connected between the bit line (BL) and the variable resistance device R1.

Referring to FIG. 13B, a unit cell MC2 includes a variable resistance device R2 and a select device S2. Unlike FIG. 13A, the select device S2 shown in FIG. 13B is a diode. The variable resistance device R2 is connected between the bit line (BL) and the select device S2, and the select device S2 is connected between the variable resistance device R2 and a word line (WL). In the select device S2, an anode of the diode is connected to the variable resistance device R2 and a cathode of the diode is connected to the word line (WL). When a voltage difference between an anode and a cathode of the diode is greater than a threshold voltage, the diode turns on and a current is supplied to the variable resistance device R2.

FIG. 14 is a graph illustrating example characteristics of a variable resistance material according to an example embodiment. The variable resistance material described with regard to FIG. 14 may be included in the unit cells illustrated in FIG. 13A and FIG. 13B.

Referring to FIG. 14, a phase change material transitions to an amorphous state by heating the phase change material to a temperature higher than a melting temperature (Tm) at t1, and then rapidly cooling the phase change material. In this example, the amorphous state is a reset state representing data "1".

A phase change material transitions to a crystalline state by heating the phase change material to a temperature, which is between a crystallization temperature (Tc) and a melting temperature (Tm) for a time t2, and then gradually cooling the phase change material. The time t2 is longer than the time t1. In this example, the crystalline state is a set state representing data "0".

Thus, data may be stored by supplying a current to a phase change material and data may be read by measuring a resistance of a phase change material.

Even though a variable resistance memory device including memory cells having the characteristics described above is a semiconductor memory device, data loss may occur when repeatedly reading data from a memory cell depending on the phase change material. A variable resistance memory device in accordance with at least one example embodiment of inventive concepts may maintain data stored in a memory cell even though data is repeatedly read.

An example embodiment of a semiconductor memory device including memory cells with a phase change material having the characteristics described above will be described with reference to FIG. 15.

Figure 15:
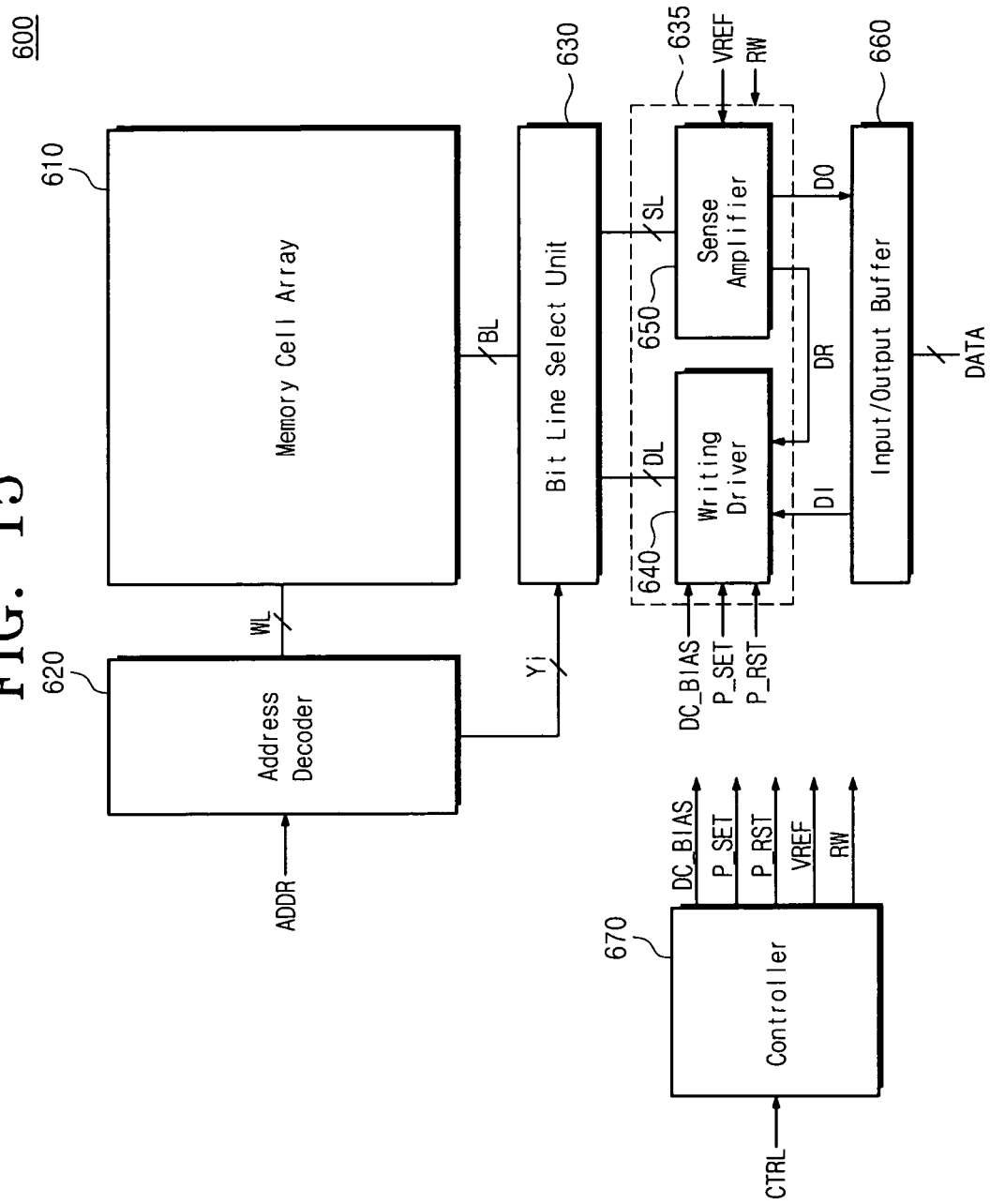
FIG. 15 is a block diagram of a variable resistance memory device in accordance with an example embodiment of inventive concepts.

Referring to FIG. 15, a variable resistance memory device in accordance with at least one example embodiment of inventive concepts includes a memory cell array 610, an address decoder 620, a bit line select unit 630, a writing driver 640, a sense amplifier 650, an input/output buffer 660 and a controller 670.

The memory cell array 610 includes a plurality of word lines (WL) and a plurality of bit lines (BL). Phase change memory cells are disposed at points where word lines (WL) and bit lines (BL) cross one another. The phase change memory cells may include a PRAM as illustrated in FIGS. 1 and 2, for example. An example embodiment of the memory cell array 610 is described in more detail below with reference to FIGS. 16 through 22.

The address decoder 620 is connected to the memory cell array 610 through word lines (WL). The address decoder 620 decodes an address (ADDR) received from the outside (e.g., a host or external device) to select a word line (WL) and a bit line (BL). The address (ADDR) includes a row address to select a word line (WL) and a column address to select a bit line (BL). The address decoder 620 generates a bit line select signal (Yi) to select a bit line (BL) and provides the bit line select signal (Yi) to the bit line select unit 630.

The bit line select unit 630 is connected to the memory cell array 610 through bit lines (BL). The bit line select unit 630 is also connected to a data input/output circuit 635 through a data line (DL) and a sense line (SL). The bit line select unit 630 electrically connects a bit line (BL) to a data line (DL) or electrically connects a bit line (BL) to a sense line (SL) in response to the bit line select signal (Yi) provided from the address decoder 620.

The data input/output circuit 635 writes data (DI) to the memory cell array 610 or reads data (DO) from the memory cell array 610. Also, the data input/output circuit 635 rewrites data (DR) read from the memory cell array 610 to the memory cell array 610. In one example, the data input/output circuit 635 includes a writing driver 640 and a sense amplifier 650.

Still referring to FIG. 15, the writing driver 640 provides a program (or writing) current to the selected bit line (BL) through the data line (DL) when performing a writing operation. More specifically, the writing driver 640 receives a set pulse (P_SET) or a reset pulse (P_RST) to generate a set current or a reset current. The writing driver 640 receives data (DI) from the input/output buffer 660 to provide a set current or a reset current to the selected global bit line (GBL0). Also, the writing driver 640 may control the amount of current provided to the selected bit line (BL) according to a bias voltage (DC_BIAS) provided from the controller 670. For example, the writing driver 640 provides a set current in response to the set pulse (P_SET) when receiving data '0', but provides a reset current in response to the reset pulse (P_RST) when receiving data '1'. An example embodiment of the writing driver 640 is described in more detail below with reference to FIG. 20. When programming a memory cell, the writing driver 640 provides a program current less than or equal to about 0.75 mA.

When performing a read operation, the sense amplifier 650 reads data (DO) from the selected memory cell through the sense line (SL). More specifically, for example, the sense amplifier 650 provides a read current to the memory cell array 610 through the sense line (SL). The sense amplifier 650 reads data (DO), which is stored in a memory cell, by comparing a voltage of the sense line (SL) with a reference voltage when performing a read operation. Data (DO) read through the sense amplifier 650 may be output to the outside (e.g., to an external device) through the input/output buffer 660. An example embodiment of the sense amplifier 650 is described in more detail below with reference to FIG. 22.

The input/output buffer 660 provides data (DATA) input from the outside (e.g., an external device) to the writing driver 640 or outputs data (DATA) read from the sense amplifier 650 to the outside (e.g., an external device).

The controller 670 outputs control signals for controlling a semiconductor memory device according to a command signal (CTRL) provided from the outside (e.g., an external device). For example, the controller 670 controls an operation of the writing driver 640 when performing a writing operation and controls an operation of the sense amplifier 650 when performing a read operation. For example, when performing a writing operation the controller 670 provides the set pulse (P_SET) or the reset pulse (P_RST) to the writing driver 640 to generate a program current. The controller 670 provides a bias voltage (DC_BIAS), to control the amount of current provided to memory cells, to the writing driver 640. When performing a read operation, the controller 670 provides a reference voltage (VREF), to be compared with a voltage of the sense line (SL), to the sense amplifier 650.

Also, the controller 670 provides a data rewriting signal (RW) to the data input/output circuit 635 to suppress and/or prevent data loss of a memory cell. In the data input/output circuit 635, data (DR) read from the sense amplifier 650 is rewritten to a memory cell through the writing driver 640. More specifically, for example, the controller 670 provides a data rewriting signal (RW) to the writing driver 640 according to the number of read operations of the sense driver 640. In one example, the controller 670 counts the number of data read operations in the sense amplifier 650. If a read operation is repeated more than a given, desired or predetermined number of times, the controller 670 provides the data rewriting signal (RW) to the writing driver 640. If the data rewriting signal (RW) is input to the writing driver 640, the writing driver 640 rewrites the read data in the memory cell corresponding to the address from which the data is read.

For example, if the data rewriting signal (RW) is input into the data input/output circuit 635 after repeatedly reading first data from a first memory cell, the first data is provided to the writing driver 640. The writing driver 640 rewrites the first data in the first memory cell. Data loss is suppressed and/or prevented by rewriting the data to the memory cell.

A data rewriting operation of a variable resistance memory device in accordance with an example embodiment of inventive concepts is described in more detail with reference to FIGS. 15 and 16.

Figure 16:
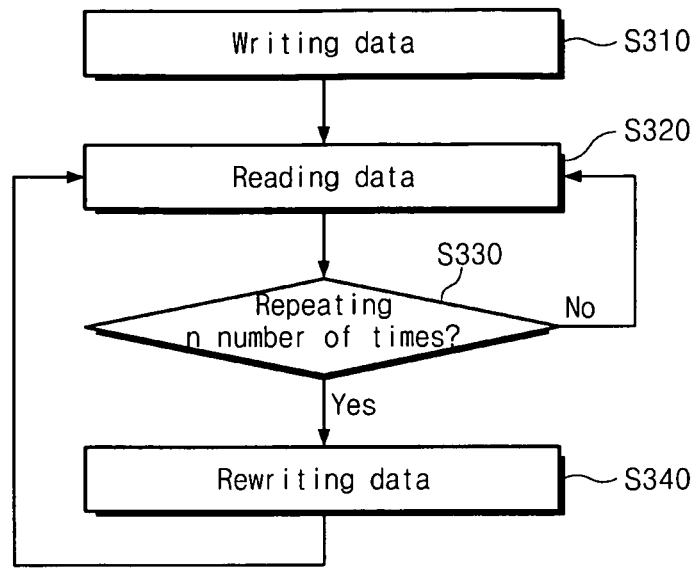
FIG. 16 is a flow chart illustrating a data rewriting method for a variable resistance memory device in accordance with example embodiments of inventive concepts.

FIG. 16 is a flow chart illustrating an example data rewriting method for a semiconductor memory device in accordance with an example embodiment of inventive concepts.

Referring to FIGS. 15 and 16, at S310 data (DI) is written in the selected memory cells through the writing driver 640. More specifically, for example, a row address and a column address are provided to a memory cell through the address decoder 620, and a memory cell in which data is written is selected based on the row and column address. The bit line select unit 630 electrically connects the data line (DL) to the selected bit line (BL) in response to the bit line select signal (Yi). Data to be written in the memory cell is provided to the writing driver 640 through the data input/output buffer 660, and the set pulse (P_SET) and the reset pulse (P_RST) are provided to the writing driver 640. A set current or a reset current is provided from the writing driver 640 to the memory cell through the data line (DL) and the bit line (BL) such that data '1' or data '0' is written in the selected memory cell(s).

At S320, data (DO) are read from the selected memory cells through the sense amplifier 650. In one example, a row address and a column address are provided to the memory cell array 610 through the address decoder 620 to select a memory cell from which data is to be read. The bit line select unit 630 electrically connects the sense line (SL) to the selected bit line (BL) in response to the bit line select signal (Yi). The sense amplifier 650 provides a read current (or a bias current) to a memory cell through the sense line (SL) and reads data stored in a memory cell by comparing a voltage of the sense line (SL) with the reference voltage (VREF) during a sense operation.

A read operation may be repeated thousands of times on a selected cell by a user and data may be lost when data is repeatedly read.

Still referring to FIG. 16, at S330 the controller 670 determines whether a data read operation has been performed (repeated) a given, desired or predetermined number of times (e.g., n number of times, where n is a positive integer). The given, desired or predetermined number may be determined according to the phase change material of a memory cell. If a data read operation has been repeated less than n number of times, the process returns to S320 and the method continues as discussed above.

Returning to S330, if a data read operation has been performed at least n number of times, the controller 70 provides the data rewriting signal (RW) to the writing driver 640 and the read data is rewritten in the selected memory cell through the sense amplifier 650 at S340. The process then returns to S320 and continues as discussed above.

Figure 17:
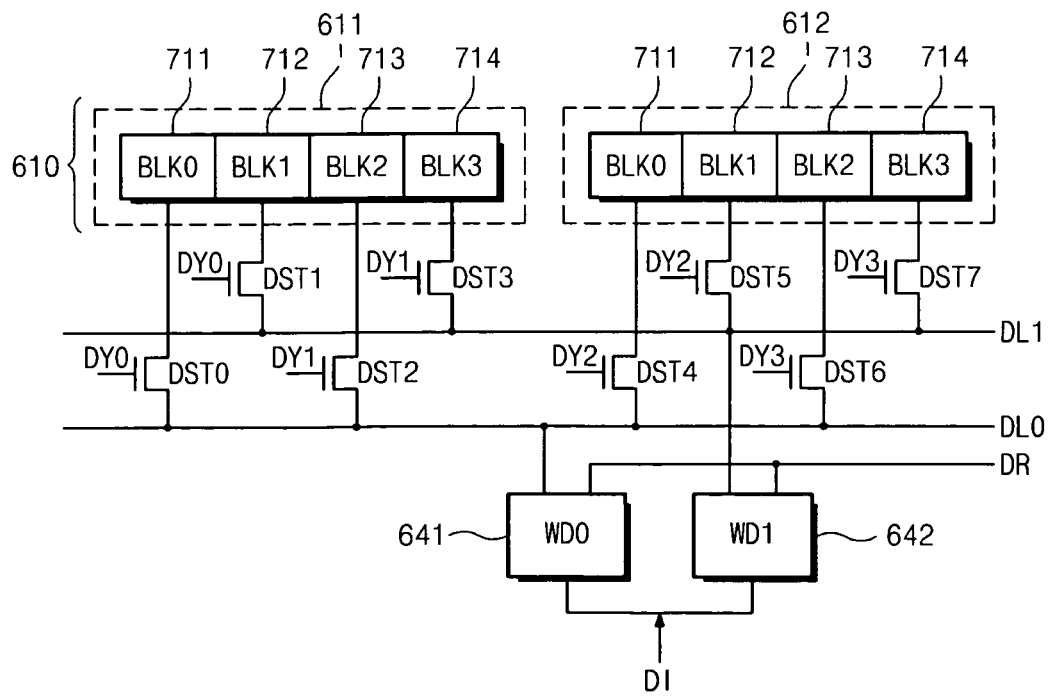
FIG. 17 is a block diagram illustrating an example connection between a memory cell array and a writing driver in a variable resistance memory device in accordance with example embodiments of inventive concepts.

FIG. 17 is a block diagram illustrating an example connection between a memory cell array and a writing driver in a variable resistance memory device in accordance with an example embodiment of inventive concepts. According to at least this example embodiment, the memory cell array 610 includes a plurality of block units 611 and 612. Each of the block units 611 and 612 includes a plurality of memory blocks 711 through 714. Although only first and second block units 611 and 612 including four memory blocks 711 through 714, respectively, are shown in FIG. 17 for convenience of a description, inventive concepts are not limited thereto.

Referring to FIG. 17, the memory cell array 610 further includes writing drivers 641 and 642, which correspond to the first block unit 611 and the second block unit 612, respectively. Each of the memory blocks 711 through 714 includes a plurality of phase change memory cells as illustrated, for example, in FIGS. 13A and 13B. Each of the memory blocks 711 through 714 may be selectively connected to the first writing driver 641 or the second writing driver 642 by data line select transistors (DST0~DST7). The data line select transistors (DST0~DST7) selectively connects the memory blocks 711 through 714 to the writing driver 641 or the second writing driver 642 in response to a data line select signal (DYi). More specifically, for example, first and third memory blocks 711 and 713 of each of the first and second block units 611 and 612 may be connected to the first writing driver 641, whereas second and fourth memory blocks 712 and 714 of each of the first and second block units 611 and 612 may be connected to the second writing driver 642. In this example, four data writing operations are performed through the first and second writing drivers 641 and 642 to write data to the first and second block units 611 and 612.

If the data rewriting signal (RW) is input to the first and second writing drivers 641 and 642, the first and second writing drivers 641 and 642 rewrite data (DR) provided from sense amplifiers (651~658 of FIG. 18) in each of the memory blocks 711 through 714. At this time, because the number of the writing drivers 641 and 642 is less than the number of sense amplifiers (651 through 658 of FIG. 18), a rewriting operation is repeated in the first and second writing drivers 641 and 642 until all or substantially all the read data are rewritten in each of the memory blocks 711 through 714.

Figure 18:
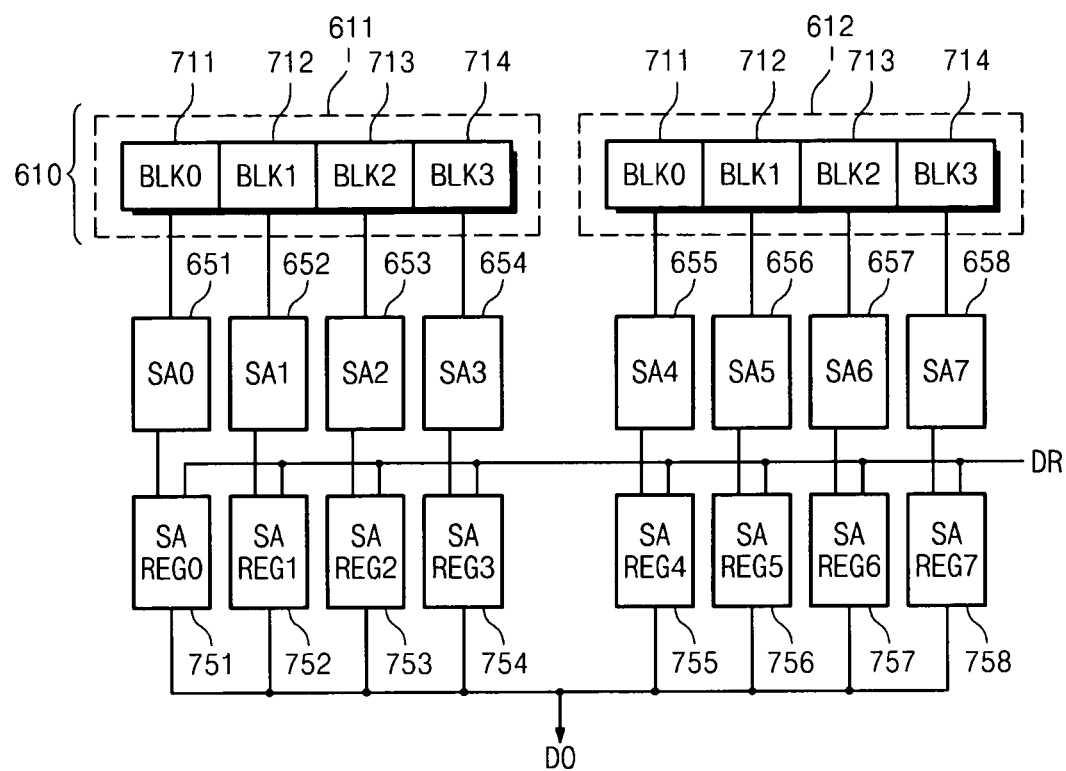
FIG. 18 is a block diagram illustrating an example connection between a memory cell array and a sense amplifier in a variable resistance memory device in accordance with example embodiments of inventive concepts.

FIG. 18 is a block diagram illustrating an example connection between a memory cell array and a sense amplifier in a variable resistance memory device in accordance with an example embodiment of inventive concepts.

Referring to FIG. 18, a memory cell array 610 includes a plurality of block units 611 and 612. Each of the block units 611 and 612 includes a plurality of memory blocks 711 through 714. In this example, the memory cell array 610 includes first and second block units 611 and 612, and each of the block units 611 and 612 includes first through fourth memory blocks 711 through 714. Each of the memory blocks 711 through 714 includes a plurality of phase change memory cells as illustrated, for example, in FIGS. 13A and 13B. Sense amplifiers 651 through 658 corresponding to the memory blocks 711 through 714, respectively, are connected to the memory blocks 711 through 714 through sense lines (SL0~SL7). Also, the sense amplifiers 651 through 658 are connected to sense amplifier registers 751 through 758, respectively, and data read from the memory blocks 711 through 714 are stored in the sense amplifier registers 751 through 758. Data to be stored in the sense amplifier registers 751 through 758 may be read from all or substantially all the memory blocks 711 through 714 by a one time read operation. The semiconductor memory device in accordance with an example embodiment of inventive concepts may read eight bit data through a one time read operation.

As illustrated in FIGS. 17 and 18, in a variable resistance memory device in accordance with example embodiments of inventive concepts, the number of the sense amplifiers 651 through 658 may be more than the number of writing drivers 641 and 642. In this example, after reading a plurality of data from the memory blocks 711 through 714, a rewriting operation is repeated through one writing driver to rewrite data in the plurality of memory blocks 711 through 714. When a rewriting signal is input to the sense amplifiers 751 through 758, data of the sense amplifier registers 751 through 758 are sequentially provided to the first and second writing drivers 641 and 642.

Figure 19:
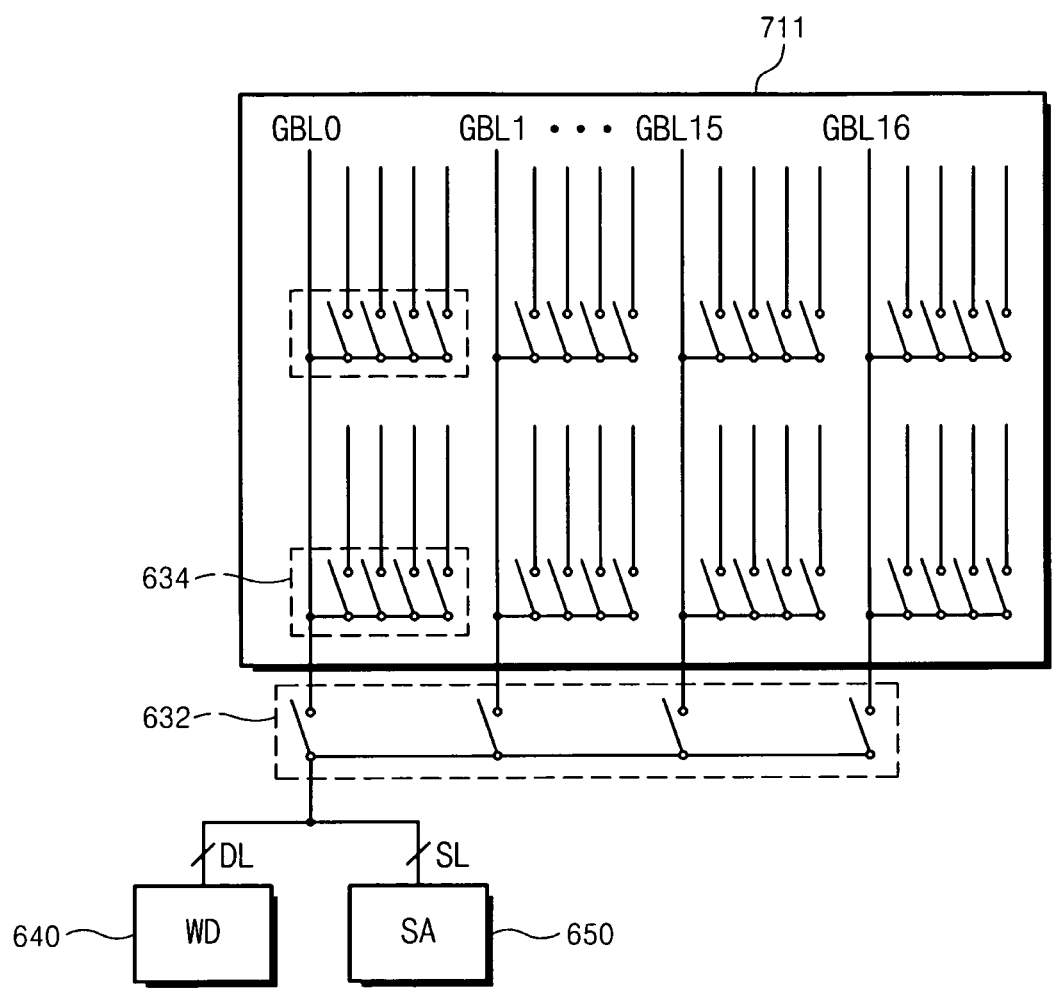
FIG. 19 is a block diagram illustrating example connections among a memory block of a memory cell array, a writing driver and a sense amplifier in a variable resistance memory device in accordance with example embodiments of inventive concepts.
Figure 20:
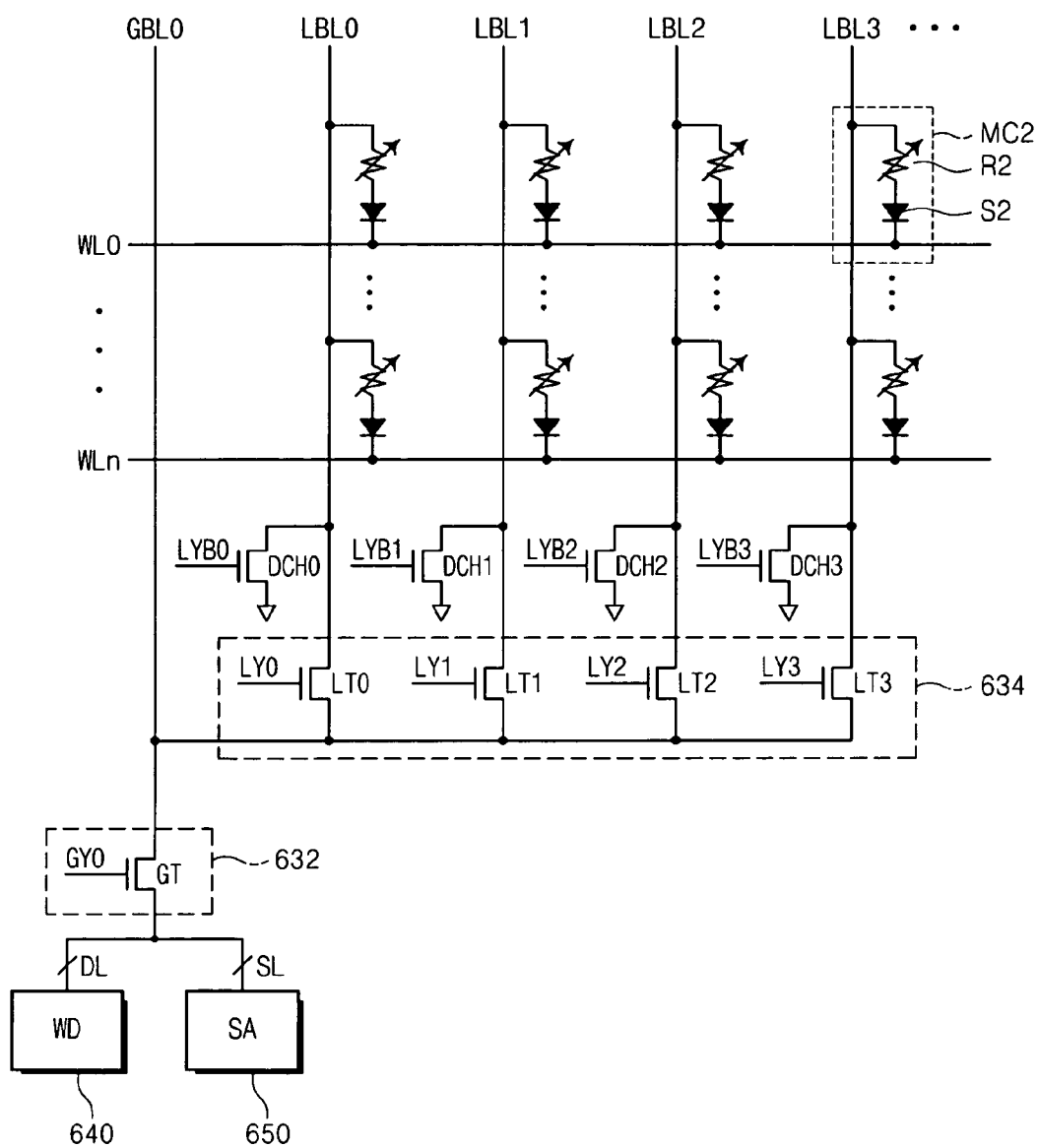
FIG. 20 is a block diagram illustrating example connections among a memory block of a memory cell array, a writing driver and a sense amplifier in a variable resistance memory device in accordance with example embodiments of inventive concepts.

FIG. 19 is a block diagram illustrating example connections among a memory block of a memory cell array, a writing driver and a sense amplifier in a variable resistance memory device in accordance with an example embodiment of inventive concepts. FIG. 20 is a block diagram illustrating example connections among a memory block of a memory cell array, a writing driver and a sense amplifier in a variable resistance memory device in accordance with another example embodiment of inventive concepts.

Referring to FIGS. 19 and 20, each of memory blocks 711 through 714 includes a plurality of word lines (WL0~WLn), a plurality of global bit lines (GBL0~GBL16) and a plurality of local bit lines (LBL0~LBL3). Memory cells MC2 are connected to points at which the word line (WL0~WLn) and the local bit lines (LBL0~LBLn) cross one another. Each of the memory cells MC2 includes a variable resistance device R2 and a select device S2.

Each memory block 711 may have a hierarchical bit line structure including the plurality of global bit lines (GBL0~GBL16) and the plurality of local bit lines (LBL0~LBL3). The plurality of local bit lines (LBL0~LBL3) are connected to one global bit line (e.g., GBL0), and the plurality of memory cells MC2 are connected to the local bit lines (LBL0~LBL3).

In a variable resistance memory device including a hierarchical bit line structure, the bit line select signal (Yi of FIG. 15) is provided from the address decoder (120 of FIG. 15) to select the memory cell MC2. The bit line select signal may include a local select signal (LYi) to select a local bit line and a global select signal (BYi) to select a global bit line. Also, the bit line select unit (130 of FIG. 15) may include a global bit line select unit 632 to select a global bit line and a local bit line select unit 634 to select a local bit line.

The global bit line select unit 632 includes a plurality of global bit line select transistors (GT). In this example, the global bit line select transistor (GT) connects a global bit line (e.g., GBL0) to the data line (DL) or the sense line (SL) in response to the global select signal (GYi).

Still referring to FIG. 20, the local bit line select unit 634 includes local bit line select transistors (LT) connected to each of the local bit lines (LBL0~LBL3). The local bit line select transistors (LT) electrically connect a local bit line (e.g. LBL0) to the selected global bit line (GBL0) in response to local select signals (LY0~LY3).

Discharge transistors (DCH0~DCH3) are connected to the local bit lines (LBL0~LBL3), respectively, to discharge voltages of the local bit lines (LBL0~LBL3) before and after a write operation and/or a read operation. The discharge transistors (DCH0~DCH3) are connected between the local bit lines (LBL0~LBL3) and a ground voltage and discharge the local bit lines (LBL0~LBL3) in response to complementary signals (LYB0~LYB3) of the local select signals (LY0~LY3). When the local bit line select transistors (LT) are turned on, the discharge transistors (DCH) are turned off.

Figure 21:
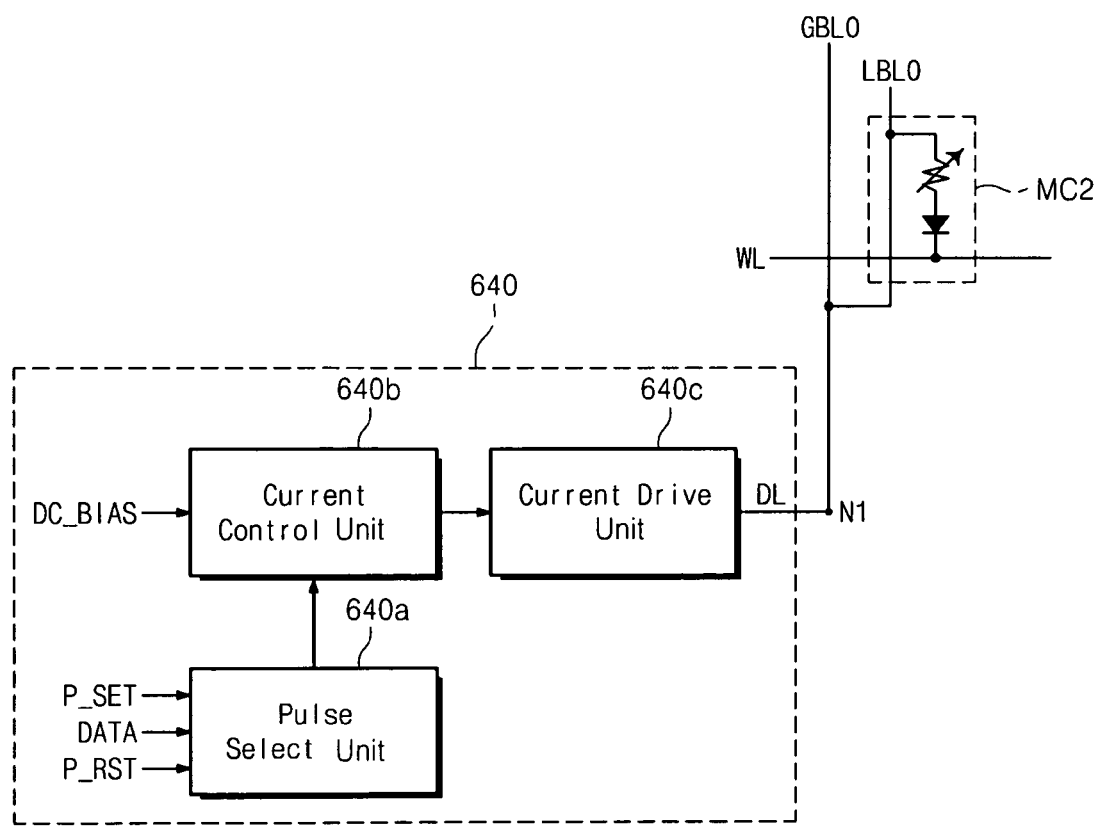
FIG. 21 is a block diagram illustrating an example embodiment of the writing driver shown in FIGS. 17 through 20.

FIG. 21 is a block diagram of an example embodiment of the writing driver illustrated in FIGS. 17 through 20.

Referring to FIG. 21, the writing driver 640 includes a pulse select unit 640a, a current controller 640b and a current drive unit 640c.

The pulse select unit 640a outputs one of a set pulse (P_SET) and a, reset pulse (R_RST) according to data (DATA), and provides the output signal to the current controller 640b. In this example, the set pulse (P_SET) and the reset pulse (R_RST) are current pulses, and an enable section of the reset pulse (R_RST) is shorter than an enable section of the set pulse (P_SET).

The current controller 640b controls the amount of current provided to the current drive unit 640c during an enable section of the reset pulse (P_RST) or an enable section of the set pulse (P_SET). More specifically, for example, the current controller 640b receives a fixed level of bias voltage (DC_BIAS) to perform a relatively stable operation. The amount of program current corresponding to the set pulse (P_SET) and the reset pulse (R_RST) is changed according to a level of the bias voltage (DC_BIAS). For example, the writing driver 640 may increase or may decrease an output level of the current controller 640b in response to a change in the level of the bias voltage (DC_BIAS).

During a writing operation, for example, the current drive unit 640c provides a set current or a reset current to the selected memory cell MC2 through the data line (DL) during an enable section of the reset pulse (P_RST) or an enable section of the set pulse (P_SET) in response to an output signal of the current controller 640b. Also, the current drive unit 640c discharges an output node (N1) during a disable section of the reset pulse (P_RST) or a disable section of the set pulse (P_SET).

Figure 22:
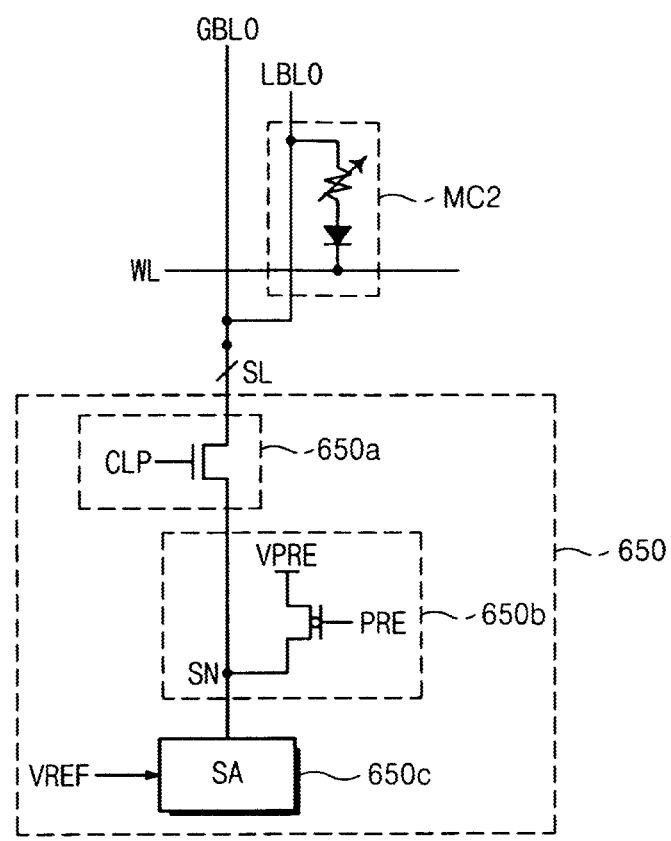
FIG. 22 is a block diagram illustrating an example embodiment of the sense amplifier shown in FIGS. 17 through 20.

FIG. 22 is a block diagram illustrating an example embodiment of the sense amplifier illustrated in FIGS. 17 through 20.

Referring to FIG. 22, the sense amplifier 650 includes a clamping circuit 650a, a precharge circuit 650b and a sense amplifier 650c.

The precharge circuit 650b precharges a sense node (SN) to a precharge voltage level before a read operation is performed. The precharge circuit 650b is connected between a power supply terminal and the sense node (SN). The precharge circuit 650b receives a precharge voltage (VPRE) and precharges the sense node (SN) to the precharge voltage (VPRE) in response to a precharge signal (PRE). The precharge signal (PRE) is provided from a controller. When a word line and a bit line are selected by an address decoder, and a read operation begins, an operation of the precharge circuit 650b is stopped.

The clamping circuit 650a clamps a sense line (SL) to a given, desired or predetermined voltage level under a threshold voltage of a phase change material (GST) when performing a read operation. This is because a phase of a phase change material included in the selected phase change memory cell is changed if a voltage greater than a threshold voltage is applied to the sense line (SL). For example, when a read operation is performed, a clamp control signal (CMP) of a given, desired or predetermined voltage level is applied to a gate of the clamping circuit 650a. As a result of the clamped voltage level, a read current is provided to the selected memory cell MC2 and a penetration current is generated according to a resistance of a phase change material.

The sense amplifier 650c receives a reference voltage (VREF) from the controller (670 of FIG. 15) to compare a voltage of the sense node (SN) with the reference voltage (VREF) and output a comparison result when a read operation is performed. In one example, a voltage level of the sense node (SN) changes as a penetration current is generated from a memory cell. Thus, the sense amplifier 650c reads a logic level of the memory cell MC2 by comparing a voltage level of the sense node (SN) with the level of the reference voltage (VREF).

Figure 23:
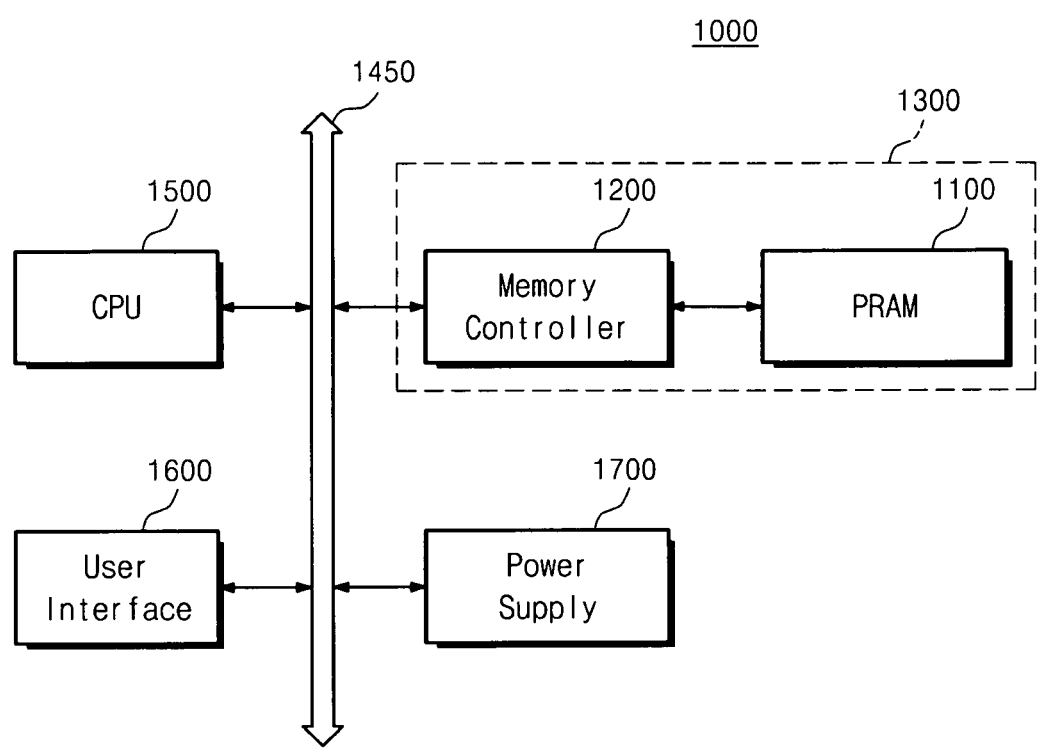
FIG. 23 is a block diagram of a computing or electronic system in accordance with an example embodiment of inventive concepts.

FIG. 23 is a block diagram of a computing or electronic system in accordance with another example embodiment of inventive concepts.

Referring to FIG. 23, a computing system 1000 includes a semiconductor memory device 1300 having a variable resistance memory device 1100 (e.g., a PRAM) and a memory controller 1200. The semiconductor memory device 1300 is connected to a system bus 1450. The computing system 1000 further includes a central processing unit 1500, a user interface 1600 and a power supply 1700 that are also electrically connected to a system bus 1450.

Data provided through the user interface 1600 or processed by the central processing unit 1500 is stored in the variable resistance memory device 1100 through the memory controller 1200. The variable resistance memory device 1100 may be constituted by a solid state drive (SSD). In this case, a writing speed of the computing system 1000 may be improved (e.g., substantially improved).

Although not illustrated in the drawings, computing systems in accordance with inventive concepts may further include an application chipset, a camera image processor (CIS), a mobile DRAM or the like.

According to example embodiments of inventive concepts, after repeating a data read operation a given, desired or predetermined number of times, the read data is rewritten to a memory cell, thereby suppressing and/or preventing data loss due to the repeated data read operations. Therefore, reliability of the variable resistance memory device may be improved.

The computing or electronic systems discussed herein may be connected to an external device, for example, a personal computer or a network, by using an input/output device and may exchange data with the external device.

For example, such an electronic or computing system may embody various electronic control systems requiring a memory, and for example, may be used in mobile phones, MP3 players, navigation devices, solid state disks (SSD), or household appliances.

Figure 24:
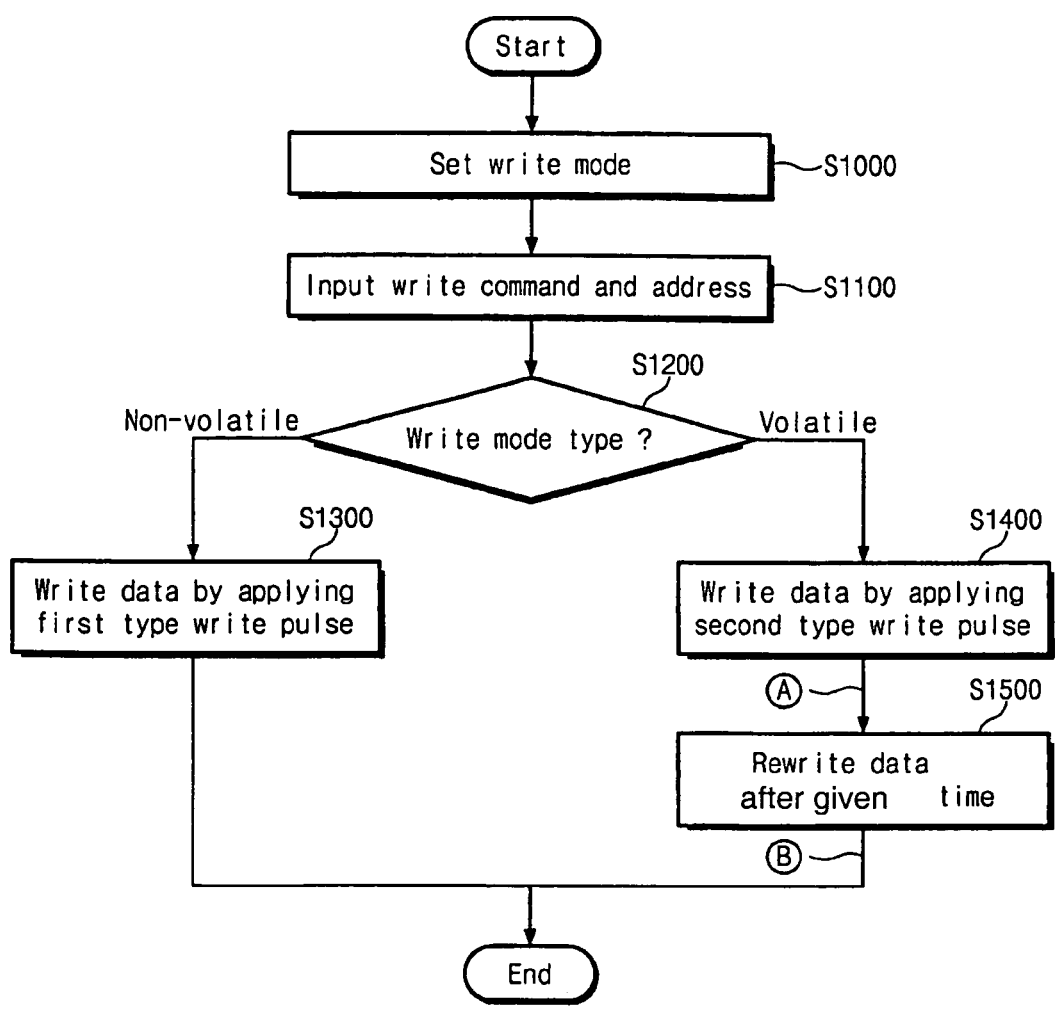
FIG. 24 is a flowchart illustrating a data write method for a phase change memory device according to an example embodiment.

FIG. 24 is a flowchart illustrating a data write method for a phase change memory device according to an example embodiment.

Referring to FIG. 24, at S1000 the phase change memory device sets a write mode according to the control of a controller or a host. The write mode may be divided into a volatile write mode VOL and a non-volatile write mode NONVOL. The volatile write mode VOL may be divided into a first write operation for writing volatile data on a phase change memory cell and a second write operation for rewriting the volatile data written during the first write operation after a given, desired or predetermined time period.

At S1100, a write command and an address is input from a host, and then a type of write mode to be performed is determined at S1200.

According to a determination result at S1200, if the set write mode is a non-volatile write mode NONVOL, a write pulse of a first type is applied to a memory cell to write data at S1300. The first type write pulse may be a set pulse SP 1 and a reset pulse RSP 1 for writing data on a memory cell to be non-volatile.

Returning to S1200, if the set write mode is the volatile write mode VOL according to a determination result, then a write pulse of a second type is applied to write data at S1400.

The data written during operation is then rewritten after a given, desired or predetermined time at S1500. The rewrite operation at S1500 may be repeatedly performed after a given, desired or predetermined time period. The write operations performed at operations S1400 and S1500 may be performed in a write driver under the control of the control logic.

The write operation performed at S1400 may be a first write operation of the volatile write mode VOL, and the write operation performed at S1500 may be a second write operation of the volatile write mode VOL. The second type write pulse performed at S1400 is the set pulse SP 2 and the reset pulse RSP 2 for writing data to a memory cell to be volatile.

Figure 25:
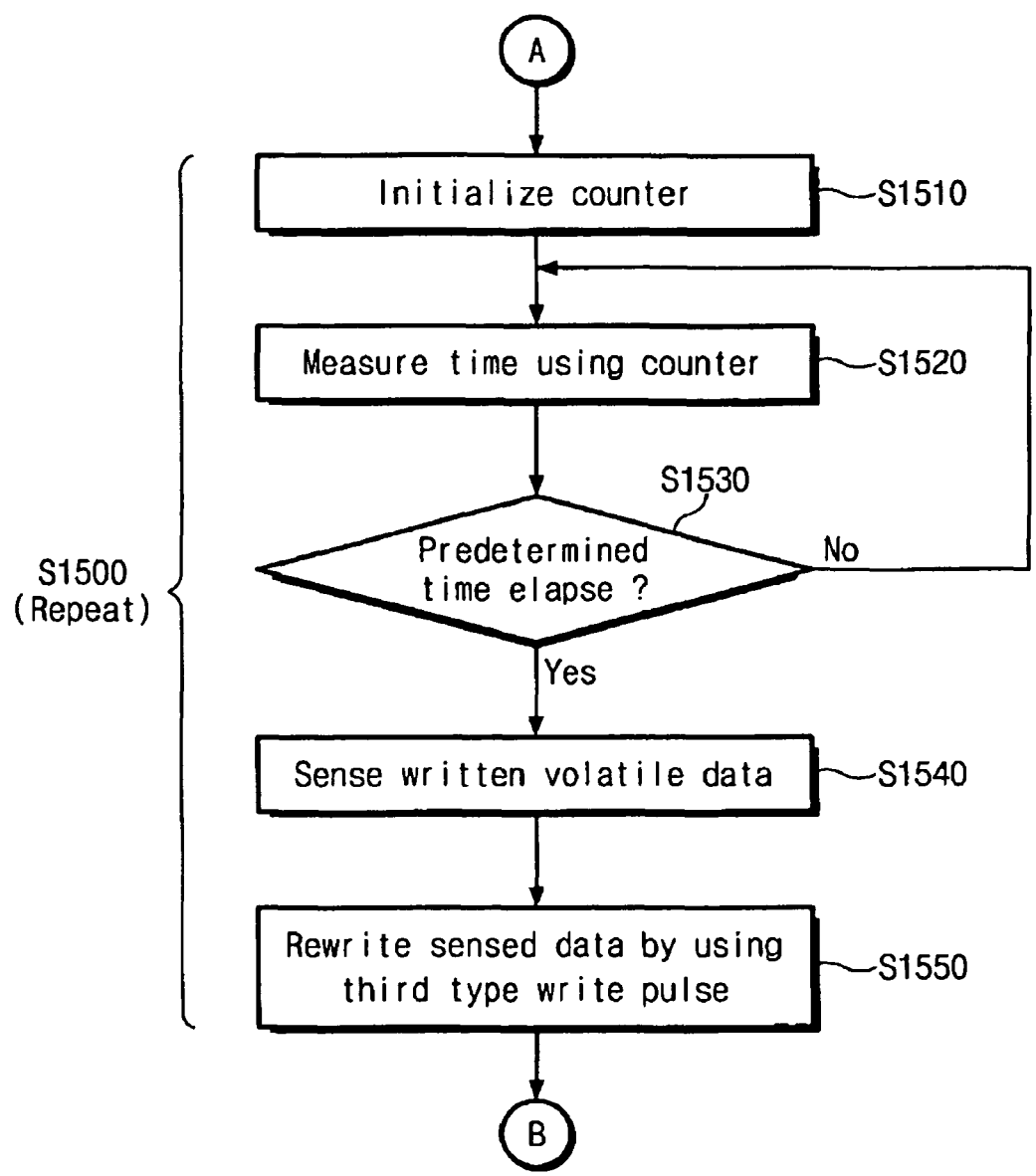
FIG. 25 is a flowchart illustrating a more detailed example embodiment of operation S1500 shown in FIG. 24.

FIG. 25 is a flowchart illustrating a more detailed example embodiment of operation S1500 shown in FIG. 24.

Referring to FIG. 25, to perform a second write operation of a volatile write mode VOL, a counter (not shown) in the control logic is initialized at S1510. Then, time is measured using the initialized counter at S1520. For example, the counter may be configured to count time by counting a number of activated clocks after performing a reset operation.

Based on the measurement result at S1520, whether a given, desired or predetermined time has elapsed or not is determined at S1530.

If the given, desired or predetermined time has not elapsed, the process returns to S1520 and continues as discussed herein.

Returning to S1530, if the given, desired or predetermined time has elapsed, then the volatile data written at S1400 is detected (or sensed) at S1540. The data detection may be performed in a sense amplifier under the control of the control logic. The data detected in the sense amplifier may not be externally output, but are provided into the write driver in the phase change memory device.

At S1550, the write driver rewrites the data provided from the sense amplifier to a memory cell using a third type write pulse at S1550. In FIG. 25, operations S1510 through S1550 may be repeatedly performed after a given, desired or predetermined time period.

The third type write pulse used at S1550 are set pulses, SP 3-1 and SP 3-2, and reset pulses, RSP 3-1 and RSP 3-2, for rewriting volatile data on a memory cell.

According to types of a data write mode, an applying time of a set pulse SPj and a reset pulse RSPj (where j is a positive integer) varies. For example, an application time of a second type write pulse may be shorter than that of a first type write pulse, and an application time of the third type write pulse may be shorter than that of a second type write pulse. Additionally, an application time and an application period of the third type write pulse may vary according to the number of repeating rewrite operations. An application time of the first to third type write pulses may be determined by at least one of types, component ratios, and doping methods of a phase change material constituting a phase change memory cell.

As described above, U.S. patent application Ser. No. 12/320,963 is incorporated herein in its entirety by reference. U.S. patent application Ser. No. 12/320,963 discloses a write method for a phase change memory device. The write method includes; setting a write mode as one of a volatile write mode and a non-volatile write mode; and writing data as volatile or non-volatile on a phase change memory cell of the phase change memory device by applying a write pulse corresponding to the write mode. When power is not supplied to the phase change memory device the non-volatile data is retained and the volatile data is not retained. The phase change memory device may correspond to a PRAM as illustrated in FIGS. 1 and 2.

According to at least some example embodiments, the phase change material may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$-$S_2$ alloy, for example.

In an example embodiment, the phase change material may be made of a transition metal oxide having multiple resistance states, as described above. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The phase change material may be a chemical compound including one or more elements selected from the group consisting of S, Se, Te, As, Sb, Ge, Sn, In and Ag.

The above-disclosed subject matter is to be considered illustrative, and not restrictive, and the appended claims are intended to cover all such modifications, enhancements, and other embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

While some inventive concepts have been particularly shown and described with reference to example embodiments thereof, it will be understood by those of ordinary skill in the art that various changes in form and details may be made therein without departing from the spirit and scope of inventive concepts as defined by the following claims.

What is claimed is:

1. A memory system comprising:
    a memory cell array having a plurality of memory sectors, each of the plurality of memory sectors including a plurality of phase change memory cells;
    a refresh register configured to store location information for a refreshed memory sector among the plurality of memory sectors included in the memory cell array; and
    a controller configured to write data in the memory cell array in response to a writing signal, the controller being further configured to refresh a memory sector among the plurality of memory sectors in response to each writing signal, the memory sector among the plurality of memory sectors being a target sector subsequent to the refreshed memory sector, and being determined based on the stored location information for the refreshed memory sector; wherein
    when N phase change memory cells are programmed, a programming current is less than or equal to about 0.75 mA*N, and N is a positive integer, and
    the refresh register is configured to store location information for only a single, most recently refreshed memory sector.

2. The memory system of claim 1, wherein the controller is further configured to refresh a next of the plurality of memory sectors according to the location information for the refreshed memory sector.

3. The memory system of claim 1, wherein the plurality of memory sectors are refreshed by a reprogram method.

4. The memory system of claim 1, wherein the controller refreshes the plurality of memory sectors in a given, desired or predetermined order.

5. The memory system of claim 1, further comprising:
    a time control unit configured to store a current time when the memory system powers up.

6. The memory system of claim 5, wherein the time control unit stores a refresh cycle completion time indicating a time at which a refresh operation is completed on all memory sectors of the memory cell array.

7. The memory system of claim 6, wherein a refresh operation is performed on all the memory sectors of the memory cell array if a difference between the current time and the refresh cycle completion time is greater than a reference time.

8. The memory system of claim 7, wherein the reference time is less than a guarantee time of the memory cell array.

9. The memory system of claim 7, wherein the reference time decreases as the number of the memory sectors increases.

10. The memory system of claim 1, wherein the phase change memory cells are formed of a material having a crystallization temperature between 100° C. and 150° C.

11. A memory controller configured to generate a writing control signal for transmitting data to a phase change memory device and configured to generate a refresh control signal for refreshing data stored in the phase change memory device in response to a received writing command, the memory controller comprising:
    a refresh register configured to store location information for a refreshed memory sector among memory sectors included in the phase change memory device; wherein
    the memory controller is configured to generate the refresh control signal based on the stored location information for the refreshed memory sector so that a refresh operation is performed on a target sector, which is subsequent to the refreshed memory sector, and
    the refresh register is configured to store location information for only a single, most recently refreshed memory sector.

12. The memory controller of claim 11, further comprising:
    a buffer memory configured to store at least one of data to be written in the memory device and data received from the memory device; and
    a refresh memory configured to store data from the target sector.

13. The memory controller of claim 12, further comprising:
 a time control unit configured to calculate a time difference by comparing a completion time information of a refresh cycle with current time information, and configured to compare the calculated time difference with data retention time information of a memory cell included in the memory sector to determine whether to perform a refresh operation.

14. The memory controller of claim 11, wherein the memory controller is configured to control a Low Power Double Data Rate 2 (LPDDR2) memory.

* * * * *